United States Patent
Tseng et al.

(10) Patent No.: US 10,957,551 B2
(45) Date of Patent: Mar. 23, 2021

(54) FIN-LIKE FIELD EFFECT TRANSISTOR PATTERNING METHODS FOR INCREASING PROCESS MARGINS

(71) Applicant: Taiwan Semiconductor Manufacturing Co., Ltd., Hsin-Chu (TW)

(72) Inventors: Chin-Yuan Tseng, Hsinchu (TW); Wei-Liang Lin, Hsin-Chu (TW); Hsin-Chih Chen, Hsin-Chu (TW); Shi Ning Ju, Hsinchu (TW); Ken-Hsien Hsieh, Taipei (TW); Yung-Sung Yen, New Taipei (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/571,922

(22) Filed: Sep. 16, 2019

(65) Prior Publication Data
US 2020/0013630 A1    Jan. 9, 2020

Related U.S. Application Data

(63) Continuation of application No. 15/382,035, filed on Dec. 16, 2016, now Pat. No. 10,418,252.

(51) Int. Cl.
*H01L 21/8234* (2006.01)
*H01L 21/308* (2006.01)
*H01L 29/66* (2006.01)
*H01L 21/311* (2006.01)

(52) U.S. Cl.
CPC .. *H01L 21/3086* (2013.01); *H01L 21/823431* (2013.01); *H01L 29/66795* (2013.01); *H01L 21/31144* (2013.01)

(58) Field of Classification Search
CPC ........... H01L 21/3086; H01L 21/31144; H01L 21/31116; H01L 21/31127; H01L 21/823431; H01L 29/66795
USPC ....... 438/303, 366, 424, 702, 703, 714, 736, 438/738, 758
See application file for complete search history.

(56) References Cited

U.S. PATENT DOCUMENTS

| | | | |
|---|---|---|---|
| 8,802,510 B2* | 8/2014 | Chang | H01L 21/3086 438/151 |
| 9,123,656 B1* | 9/2015 | Hsieh | H01L 21/3086 |
| 9,184,054 B1 | 11/2015 | Huang et al. | |

(Continued)

*Primary Examiner* — Lan Vinh
(74) *Attorney, Agent, or Firm* — Haynes and Boone, LLP

(57) ABSTRACT

Methods are disclosed herein for patterning integrated circuit devices, such as fin-like field effect transistor devices. An exemplary method includes forming a material layer that includes an array of fin features, and performing a fin cut process to remove a subset of the fin features. The fin cut process includes exposing the subset of fin features using a cut pattern and removing the exposed subset of the fin features. The cut pattern partially exposes at least one fin feature of the subset of fin features. In implementations where the fin cut process is a fin cut first process, the material layer is a mandrel layer and the fin features are mandrels. In implementations where the fin cut process is a fin cut last process, the material layer is a substrate (or material layer thereof), and the fin features are fins defined in the substrate (or material layer thereof).

20 Claims, 20 Drawing Sheets

(56) References Cited

U.S. PATENT DOCUMENTS

| | | |
|---|---|---|
| 9,263,287 B2 | 2/2016 | Tsao et al. |
| 9,287,130 B1 | 3/2016 | Cai et al. |
| 9,337,101 B1 | 5/2016 | Sung et al. |
| 9,397,099 B1 | 7/2016 | Huang |
| 9,564,446 B1 | 2/2017 | Weybright et al. |
| 9,865,704 B2 * | 1/2018 | Xie ................. H01L 21/76224 |
| 10,586,732 B2 * | 3/2020 | Mignot ............. H01L 21/02063 |
| 2012/0100706 A1 | 4/2012 | Sim et al. |
| 2013/0277720 A1 | 10/2013 | Kim et al. |
| 2014/0273464 A1 | 9/2014 | Shieh et al. |
| 2015/0056724 A1 | 2/2015 | Shieh et al. |
| 2015/0214117 A1 * | 7/2015 | Cheng ............. H01L 21/823431 438/504 |
| 2015/0228542 A1 | 8/2015 | Chiu et al. |
| 2016/0043032 A1 | 2/2016 | Wang et al. |
| 2016/0079063 A1 | 3/2016 | Lee et al. |
| 2016/0124300 A1 | 5/2016 | Ho et al. |

* cited by examiner

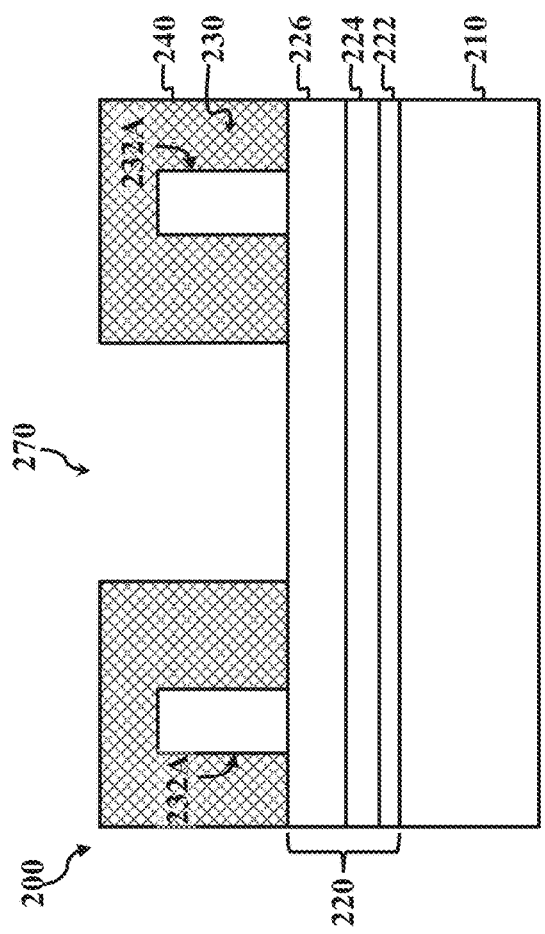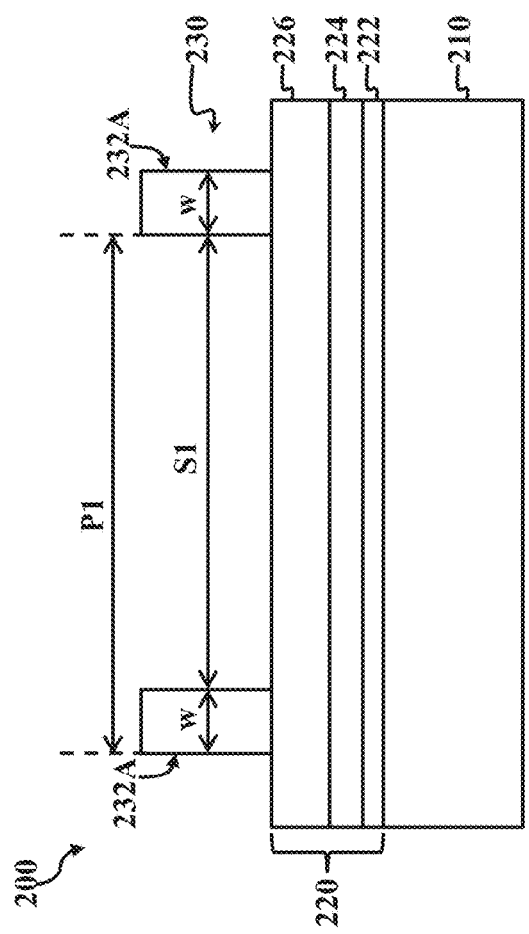

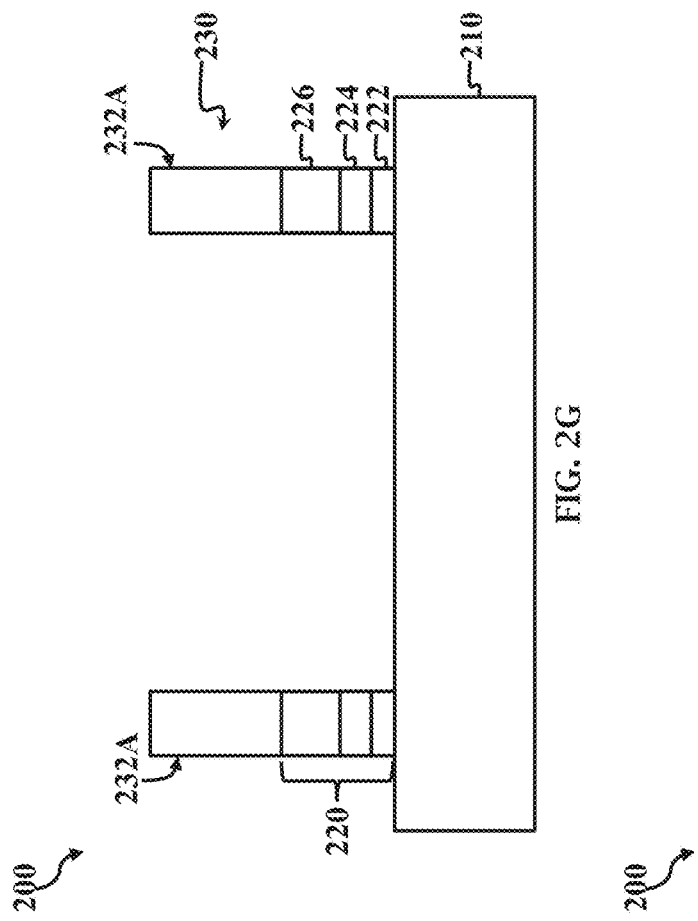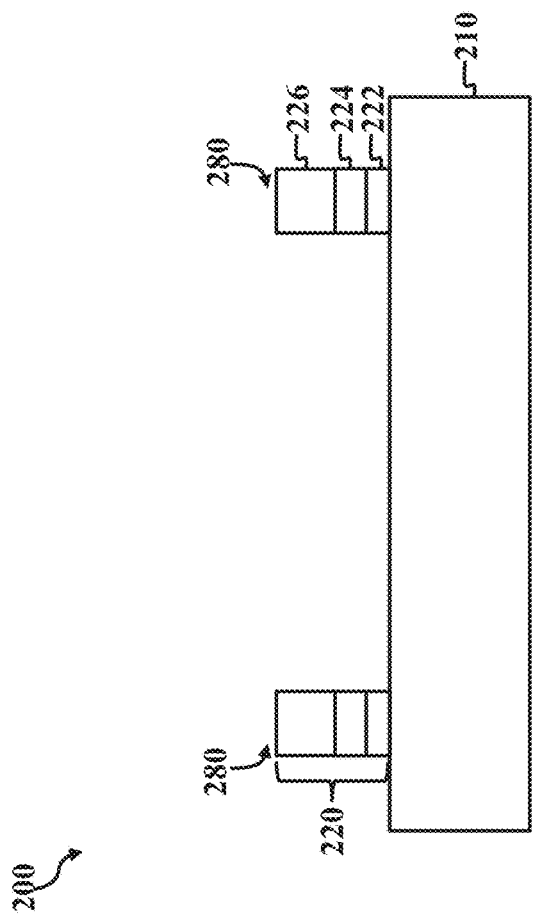

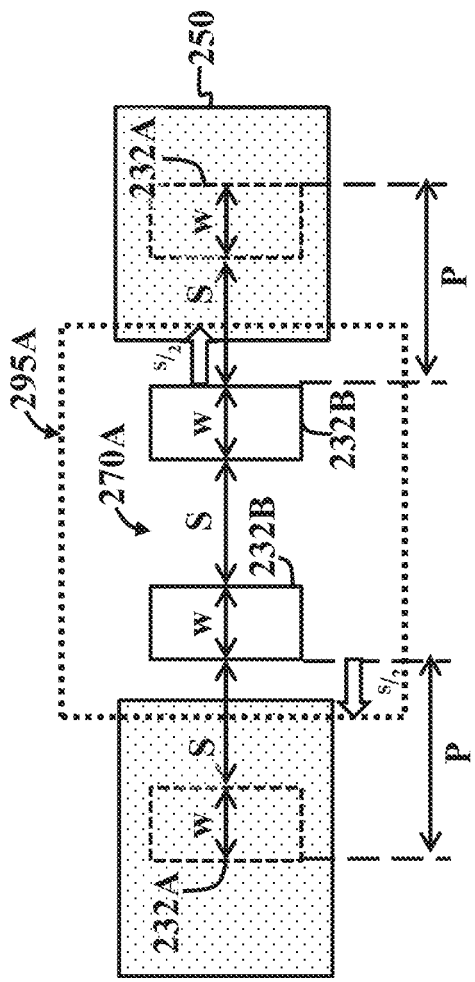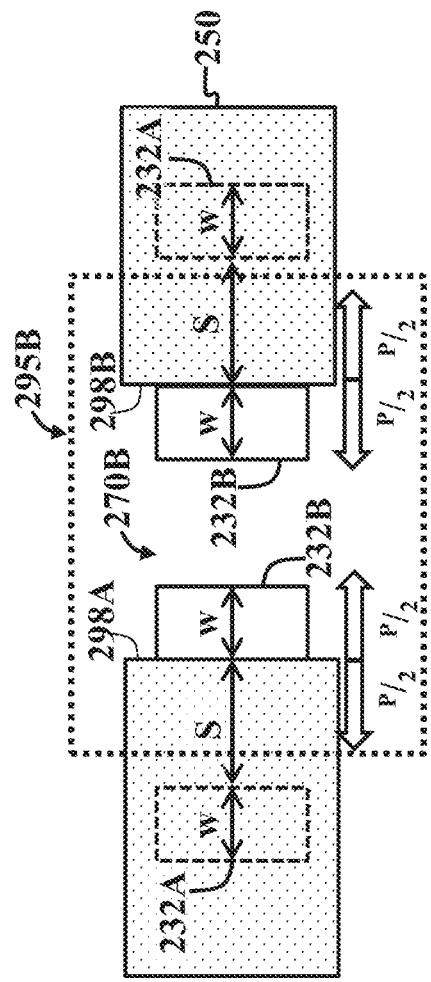
FIG. 3A
FIG. 3B

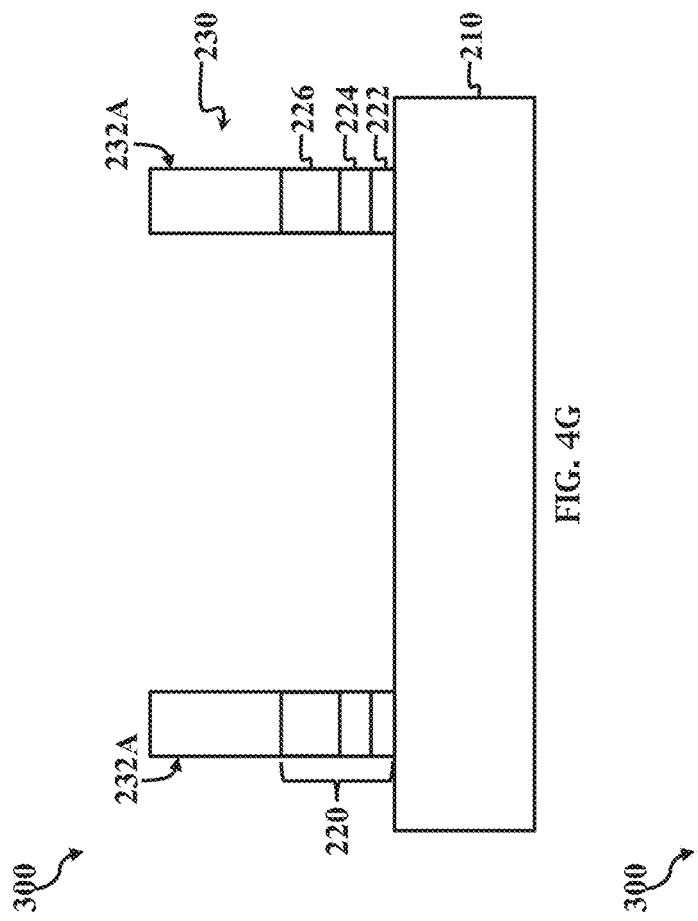
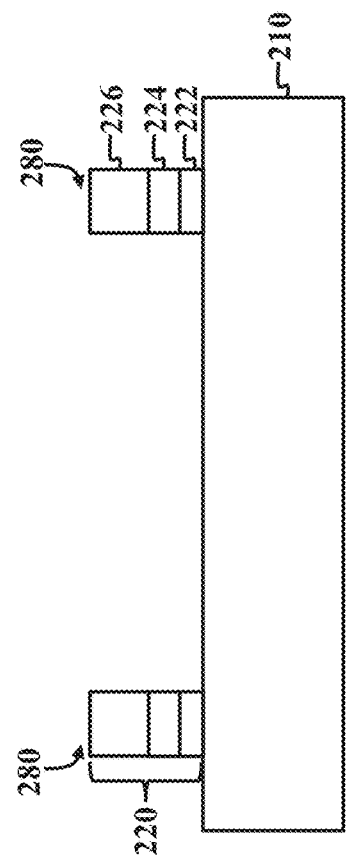
FIG. 4G
FIG. 4H

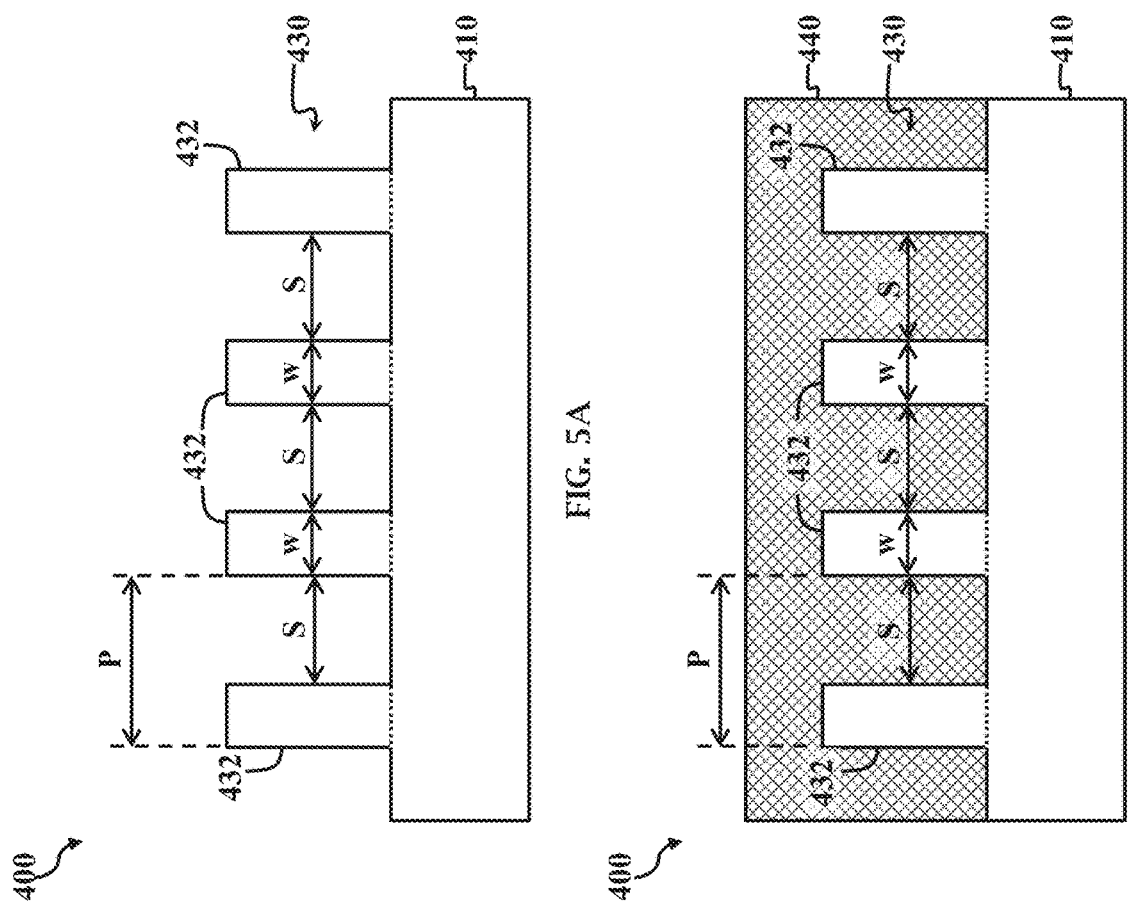

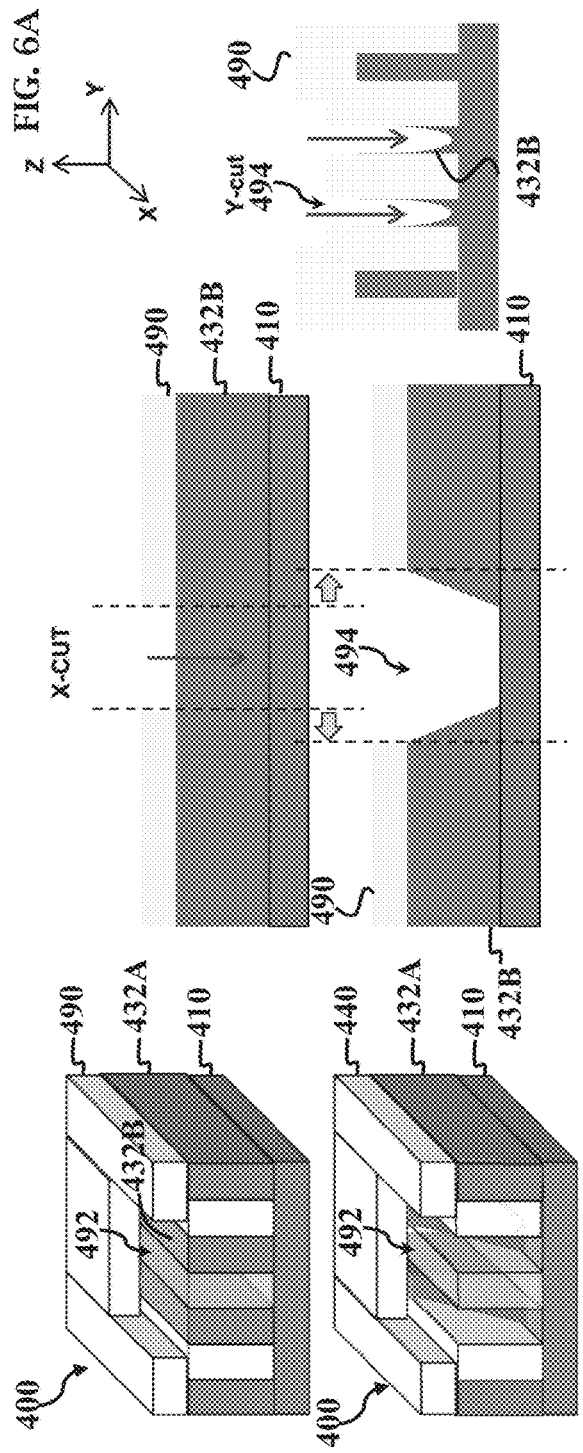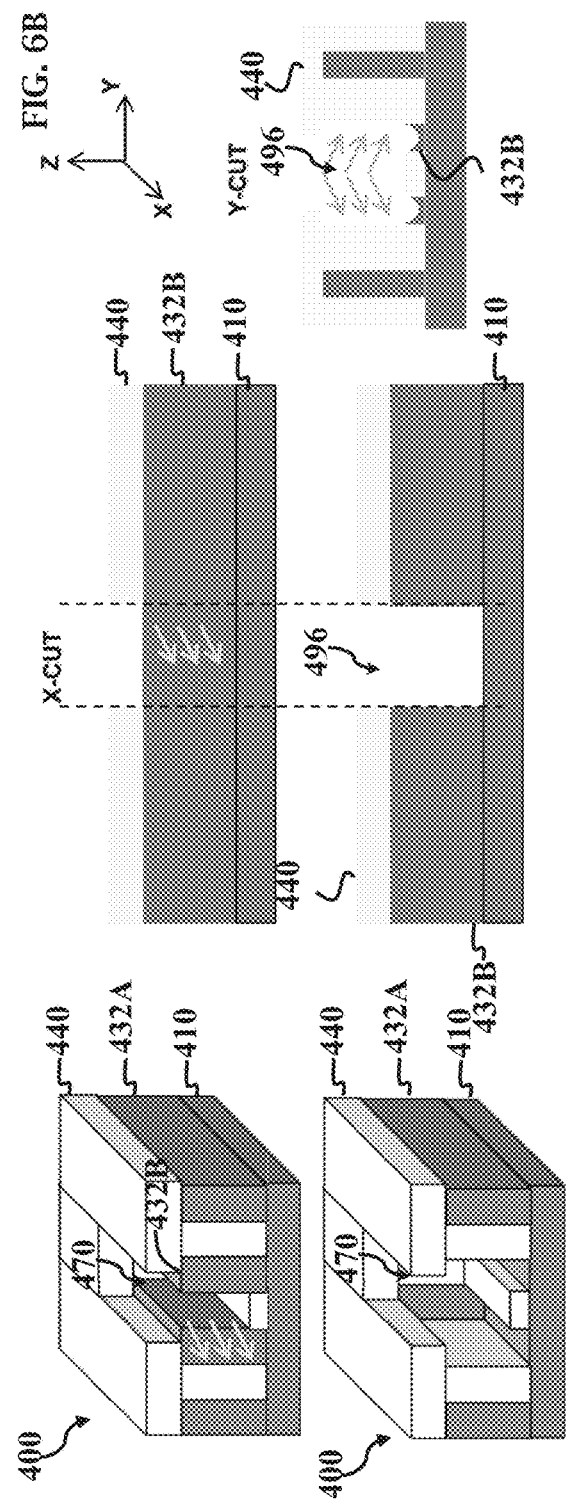

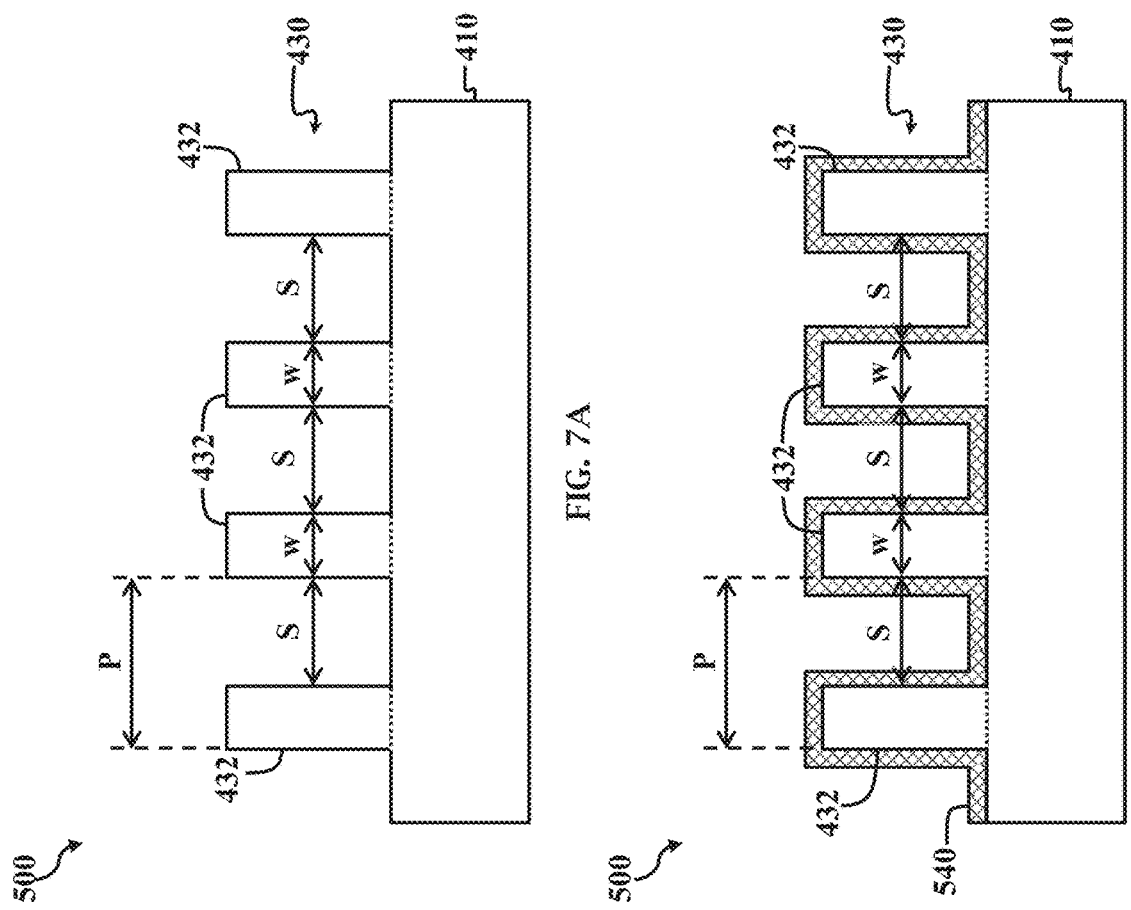

FIN-LIKE FIELD EFFECT TRANSISTOR PATTERNING METHODS FOR INCREASING PROCESS MARGINS

This application is a continuation application of U.S. patent application Ser. No. 15/382,035, filed Dec. 16, 2016, the entire disclosure of which is herein incorporated by reference.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), FinFET patterning processes are significantly constrained by decreasing process margins, including decreasing overlay margins. Accordingly, although existing fin patterning processes have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2I are fragmentary diagrammatic views of a FinFET device, in portion or entirety, at various fabrication stages, such as those associated with the method of FIG. 1, according to various aspects of the present disclosure.

FIGS. 3A-3D are fragmentary top views of a FinFET device, in portion or entirety, at various stages of a fin cut process, according to various aspects of the present disclosure.

FIGS. 4A-4I are fragmentary diagrammatic views of another FinFET device, in portion or entirety, at various fabrication stages, such as those associated with the method of FIG. 1, according to various aspects of the present disclosure.

FIGS. 5A-5F are fragmentary diagrammatic views of yet another FinFET device, in portion or entirety, at various fabrication stages, such as those associated with the method of FIG. 1, according to various aspects of the present disclosure.

FIG. 6A and FIG. 6B are various views of a FinFET device, in portion or entirety, at stages of a fin cut process, according to various aspects of the present disclosure.

FIGS. 7A-7F are fragmentary diagrammatic views of yet another FinFET device, in portion or entirety, at various fabrication stages, such as those associated with the method of FIG. 1, according to various aspects of the present disclosure.

DETAILED DESCRIPTION

Figure 1:
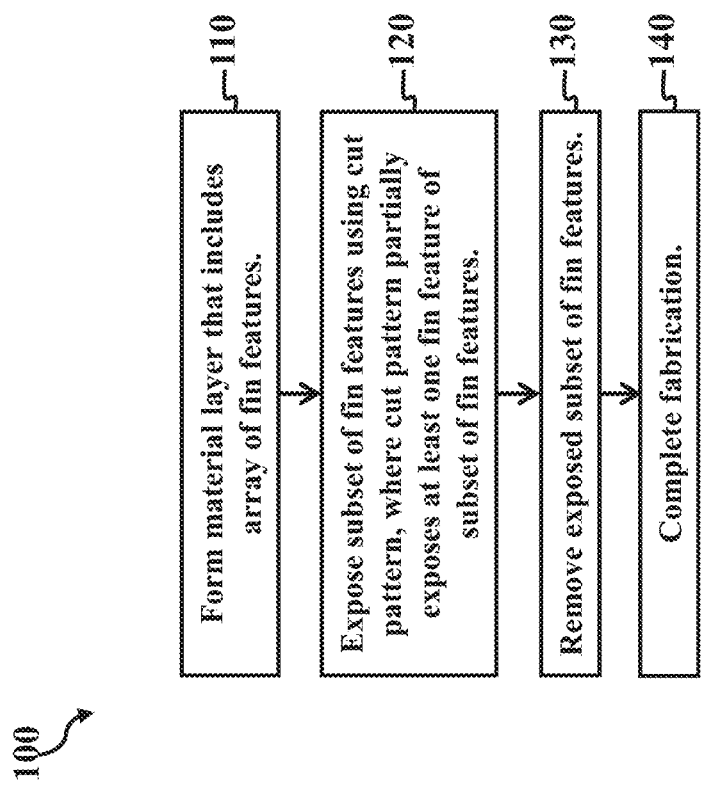
FIG. 1 is a flow chart of a method for fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 for fabricating an integrated circuit (IC) device according to various aspects of the present disclosure. In some implementations, the IC device includes a fin-like field effect transistor (FinFET) device, which generally refers to any fin-based transistor device, such as a fin-based, multi-gate transistor. As described further below, method 100 can increase patterning process windows, such as overlay process windows, ease IC manufacturability, and/or increase IC design layout flexibility. Additional steps can be provided before, during, and after method 100, and some of the steps described can be moved, replaced, or eliminated for additional embodiments of method 100.

At block 110, a material layer is formed that includes an array of fin features. In some implementations, the material layer is a mandrel layer (for example, including an array of mandrels) and the fin features are mandrels. In some implementations, the material layer is a fin layer of a substrate (for example, including an array of fins) and the fin features are fins. The method proceeds to block 120 and block 130, where a fin cut process is performed on the material layer to remove a subset of the fin features. At block 120, the fin cut process includes exposing the subset of fin features using a cut pattern, where the cut pattern partially exposes at least one fin feature of the subset of fin features. For example, a guarding material layer that includes a cut pattern is formed over the material layer, such that the guarding material layer includes an opening that exposes the subset of the fin features. The opening partially exposes at least one fin feature, such that a portion (for example, a sidewall) of the at least one fin feature is free of the guarding material layer and a portion (for example, another sidewall) of the at least one fin feature is covered by the guarding material layer. At block 130, the fin cut process includes removing the exposed subset of fin features, for example, by an etching process. In implementations where the material layer is a mandrel layer, the fin cut process is a fin cut first process. In implementations where the material layer is a fin layer, the fin cut process is a fin cut last process. At block 140, method 100 may continue to complete fabrication of the integrated circuit device. For example, in fin cut first implementations, method 100 can proceed with using the mandrel layer to pattern an underlying layer to form one or more fins (in other words, a fin layer) of a FinFET device. In some implementations, the underlying layer is a material layer of a substrate. In fin cut first implementations and fin cut last implementations, method 100 can proceed with forming isolation features, such as shallow trench isolation (STI) features, in trenches defined by the fins of the fin layer.

Because method 100 partially exposes the subset of fin features to be removed, instead of fully exposing the subset of fin features to be removed, method 100 may be referred to as a partial open pattern etching (POPE) process. The discussion that follows illustrates FinFET devices that can be fabricated according to various embodiments of method 100. Though method 100 is applied herein to form fins of FinFET devices, method 100 can be applied in numerous ways to form other IC features of IC devices. As one of many examples, POPE processes disclosed herein can be implemented to form gate features and/or other IC features where larger patterning process windows are desired for easing manufacturability and/or increasing IC design layout flexibility. Such POPE processes would involve exposing a subset of gate features (or other IC features) using a cut pattern, where the cut pattern partially exposes at least one gate feature (or other IC feature) of the subset of gate features, and removing the exposed subset of gate features (or other IC features).

FIGS. 2A-2I are fragmentary diagrammatic views of a FinFET device 200, in portion or entirety, at various fabrication stages (such as those associated with method 100) according to various aspects of the present disclosure. FinFET device 200 may be included in a microprocessor, a memory, and/or other integrated circuit device. In some implementations, FinFET device 200 may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-2I have been simplified for the sake of clarity to better understand the inventive concepts of the present disclosure. Additional features can be added in FinFET device 200, and some of the features described below can be replaced, modified, or eliminated in other embodiments of FinFET device 200.

Figure 2A:
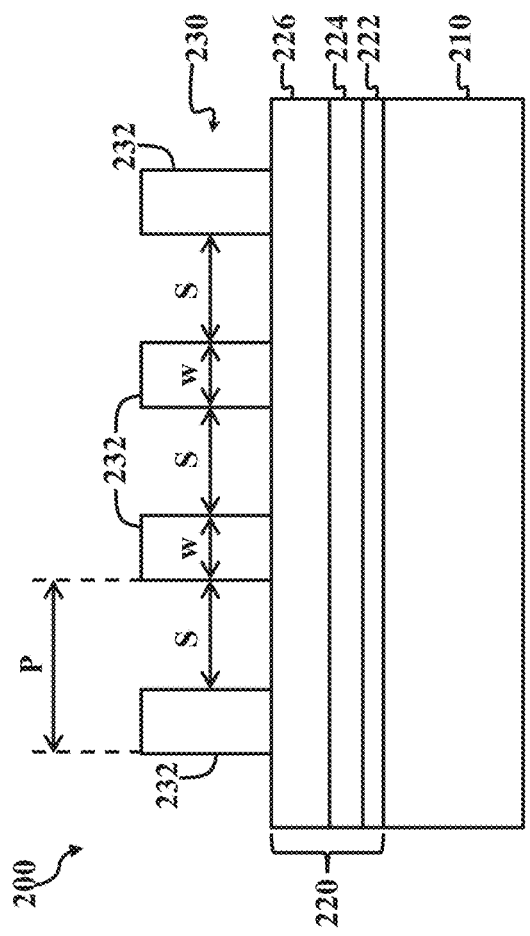

In FIG. 2A, FinFET device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 210 can include various doped regions (not shown) depending on design requirements of FinFET device 200. In some implementations, substrate 210 includes p-type doped regions (for example, p-type wells) doped with p-type dopants, such as boron (for example, BF2), indium, other p-type dopant, or combinations thereof. In some implementations, substrate 210 includes n-type doped regions (for example, n-type wells) doped with n-type dopants, such as phosphorus, arsenic, other n-type dopant, or combinations thereof. In some implementations, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. Doping may be implemented using a process such as ion implantation or diffusion in various steps and techniques.

A patterning layer 220 is formed over substrate 210. In the depicted embodiment, patterning layer 220 is a tri-layer patterning stack, which includes a bottom patterning layer 222, a middle patterning layer 224, and an upper patterning layer 226. Suitable materials are selected for these layers based, in part, on material etch selectivity. For example, bottom patterning layer 222, middle patterning layer 224, and upper patterning layer 226 may be structured to have different materials, such that each layer can be removed using a corresponding etchant without significant etching of the other layers. In other words, bottom patterning layer 222, middle patterning layer 224, and upper patterning layer 226 include materials having different etch rates. In some implementations, upper patterning layer 226 can serve as an etch mask for patterning middle patterning layer 224, bottom patterning layer 222, and/or substrate 210; middle patterning layer 224 can serve as an etch mask for patterning bottom patterning layer 222 and/or substrate 210; and bottom patterning layer 222 can serve as an etch mask for patterning substrate 210. In some implementations, bottom patterning layer 222, middle patterning layer 224, and upper patterning layer 226 include different semiconductor materials and/or different dielectric materials to achieve desired etching selectivity, such as silicon, amorphous silicon, semiconductor oxide (for example, silicon oxide ($SiO_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. For example, in some implementations, bottom patterning layer 222 includes $SiO_2$, middle patterning layer 224 includes SiN, and upper patterning layer 226 includes $SiO_2$. In some implementations, bottom patterning layer 222, middle patterning layer 224, and upper patterning layer 226 include different resist materials to achieve desired etching selectivity. In some implementations, bottom patterning layer 222 and upper patterning layer 226 include organic materials, while middle patterning layer 226 includes inorganic materials. Patterning layer 220 is formed by any suitable process. For example, bottom patterning layer 222, middle patterning layer 224, and upper patterning layer 226 can each be formed by a respective spin-coating process followed by a thermal baking process. While patterning layer 220 is depicted as a tri-layer patterning stack, patterning layer 220 can include any number of layers to achieve desired patterning results.

A mandrel layer 230 is formed over patterning layer 220. In the depicted embodiment, mandrel layer 230 includes an array of mandrels 232 (each having a width w) disposed on upper patterning layer 226, where adjacent mandrels 232 are separated by a space S. Mandrels 232 have a pitch P, where pitch generally refers to a sum of a width of an IC feature (such as w of mandrels 232) and a width of a space adjacent to the IC feature (such as S between mandrels 232) (in other words, P=w+S). Mandrels 232 correspond with fin structures (alternatively referred to as fins) to be formed in an underlying layer of FinFET device 200, such that mandrels 232 are also referred to as fin features. In some implementations, pitch P is a minimum pitch achievable between mandrels 232 by a lithography process for a given technology node. Mandrel layer 230 includes a material that is different than patterning layer 220 (in particular, upper patterning layer 226) to achieve etching selectivity during an etching process, such that mandrel layer 230 can be removed using a corresponding etchant without significant etching of upper patterning layer 226, and vice versa. In other words, mandrel layer 230 and upper patterning layer 226 include materials having different etch rates. In some implementations, mandrel layer 230 serves as an etching mask for patterning patterning layer 220. In some implementations, mandrel layer 230 includes a semiconductor material and/or a dielectric material that achieves desired etching selectivity, such as silicon, amorphous silicon, semiconductor oxide, semiconductor nitride, semiconductor oxynitride, or semiconductor carbide. For example, in implementations where upper patterning layer 226 includes $SiO_2$, mandrel layer 230 includes SiN. In some implementations, patterning layer 220 may be omitted, such that mandrel layer 230 includes a material that is different than substrate 210 to achieve etching selectivity during an etching process, such that mandrel layer 230 can be removed using a corresponding etchant without significant etching of substrate 210, and vice versa. In such implementations, mandrel layer 230 can serve as an etching mask for patterning substrate 210.

A combination of deposition, lithography and/or etching processes are performed to form mandrel layer 230, such that mandrels 232 extend from upper patterning layer 226 as illustrated in FIG. 2A. For example, forming mandrel layer 230 includes depositing a masking layer (such as an amorphous silicon layer) over upper patterning layer 226, performing a lithography process to form a patterned resist layer over the masking layer, and performing an etching process to transfer a pattern defined in the patterned resist layer to the masking layer. The deposition process can include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), spin coating, plating, other deposition methods, or combinations thereof. The lithography process can include forming a resist layer on the masking layer (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the lithography process can be implemented or replaced by other methods, such as maskless lithography, electron-beam writing, ion-beam writing, and/or nanoimprint technology. The etching process removes portions of the masking layer, where the etching process uses the patterned resist layer as an etch mask. The etching process can include a dry etching process, a wet etching process, other suitable etching process, or combinations thereof. After the etching process, the patterned resist layer is removed from the masking layer, for example, by a resist stripping process, leaving mandrel layer 230. In some implementations, mandrel layer 230 is formed by a double-patterning lithography (DPL) process, which is a method of constructing a pattern on a substrate by dividing the pattern into two interleaved patterns. DPL allows enhanced IC feature (for example, fin) density. Various DPL methodologies may be used including double exposure (such as using two mask sets), resist freezing, EUV lithography, other suitable processes, or combinations thereof.

Figure 2B:
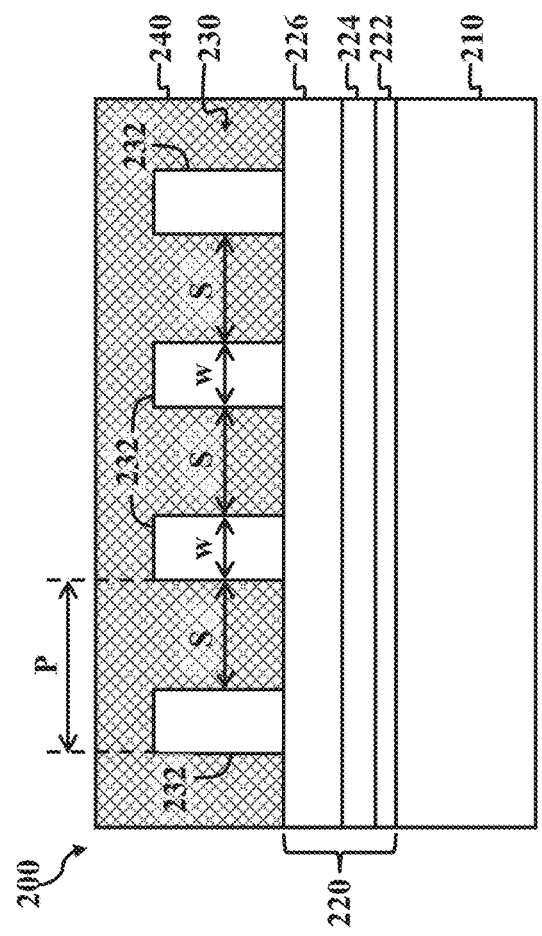

In FIGS. 2B-2F, a fin cut first POPE process is performed to remove a portion of mandrel layer 230 (for example, a subset of mandrels 232), thereby defining active regions of FinFET device 200. In FIG. 2B, a guarding material layer 240 is formed over mandrel layer 230. In the depicted embodiment, guarding material layer 240 is deposited over mandrel layer 230 by any suitable deposition process, such that guarding material layer 240 fills spaces between mandrels 232. The deposition process can include CVD, PVD, ALD, HDPCVD, MOCVD, RPCVD, PECVD, LPCVD, ALCVD, APCVD, spin coating, plating, other deposition methods, or combinations thereof. Guarding material layer 240 includes a material that is different than mandrel layer 230 to achieve etching selectivity during an etching process, such that mandrel layer 230 can be removed using a corresponding etchant without significant etching of guarding material layer 240, and vice versa. In other words, guarding material layer 240 and mandrel layer 230 include materials having different etch rates. In some implementations, guarding material layer 240 can include a semiconductor material and/or a dielectric material that achieves desired etching selectivity, such as silicon, amorphous silicon, semiconductor oxide, semiconductor nitride, semiconductor oxynitride, or semiconductor carbide. For example, in some implementations where mandrel layer 230 includes SiN, guarding material layer 240 includes silicon.

Figure 2C:
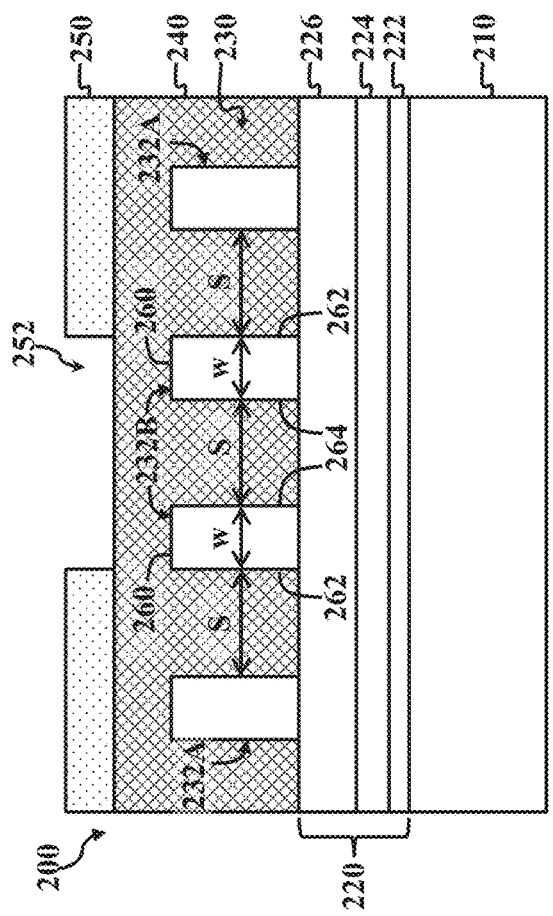

In FIG. 2C, a patterned resist layer 250 is formed over guarding material layer 240. For example, a lithography process forms patterned resist layer 250. The lithography process can include forming a resist layer on guarding material layer 240 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. Alternatively, the lithography process can be implemented or replaced by other methods, such as maskless lithography, e-beam writing, ion-beam writing, and/or nanoimprint technology. After development, patterned resist layer 250 includes a cut pattern that corresponds with the mask pattern, where the cut pattern exposes a portion of mandrel layer 230. For example, the cut pattern exposes a subset of mandrels 232, thereby defining protected mandrels 232A and unprotected (unwanted) mandrels 232B. Unprotected mandrels 232B are to be removed during the fin cut first POPE process. In the depicted embodiment, the cut pattern defines an opening 252 aligned over (overlapping) unprotected mandrels 232B, where opening 252 partially exposes unprotected mandrels 232B. For example, unprotected mandrels 232B include a top surface 260 defined between a sidewall 262 and a sidewall 264, where patterned resist layer 250 masks sidewalls 262 and unmasks top surfaces 260 and sidewalls 264, thereby exposing guarding material layer 240 covering top surfaces 260 and sidewalls 264.

In some implementations, patterned resist layer 250 partially masks top surfaces 260 of unprotected mandrels 232B, partially exposing guarding material layer 240 covering top surfaces 260. In some implementations, patterned resist layer 250 fully masks top surfaces 260 of unprotected mandrels 232B, exposing only guarding material layer 240 covering sidewalls 264. In some implementations, portions of unprotected mandrels 232B on which guarding material layer 240 is to remain are protected by patterned resist layer 250, while portions of unprotected mandrels 232B from which guarding material layer 240 is to be removed are free of patterned resist layer 250. Further, though the depicted embodiment illustrates two unprotected mandrels 232B, the present disclosure contemplates embodiments where the subset of mandrels 232 can include any number of unprotected mandrels 232B. For example, the subset of mandrels 232 exposed by the cut pattern can include a single unprotected mandrel, where the cut pattern exposes a portion (such as at least one sidewall) of the single unprotected mandrel. In another example, the subset of mandrels 232 exposed by the cut pattern can include more than two unprotected mandrels, where the cut pattern partially exposes unprotected mandrels near a perimeter of the cut pattern (for example, by exposing at least one sidewall) and fully exposes unprotected mandrels disposed between unprotected mandrels near the perimeter (for example, by exposing top surfaces and sidewalls defining unprotected mandrels). The present disclosure further contemplates implementations where patterned resist layer 250 represents a patterned hard mask layer, which has been patterned with opening 252 as described herein. In such implementations, the patterned hard mask layer can include a semiconductor material and/or a dielectric material that achieves desired etching selectivity (for example, between the patterned hard mask layer and guarding material layer 240), such as silicon, semiconductor oxide (for example, $SiO_2$), semiconductor nitride (for example, SiN), semiconductor oxynitride (for example, SiOCN), or semiconductor carbide (for example, SiCN).

Figure 2D:
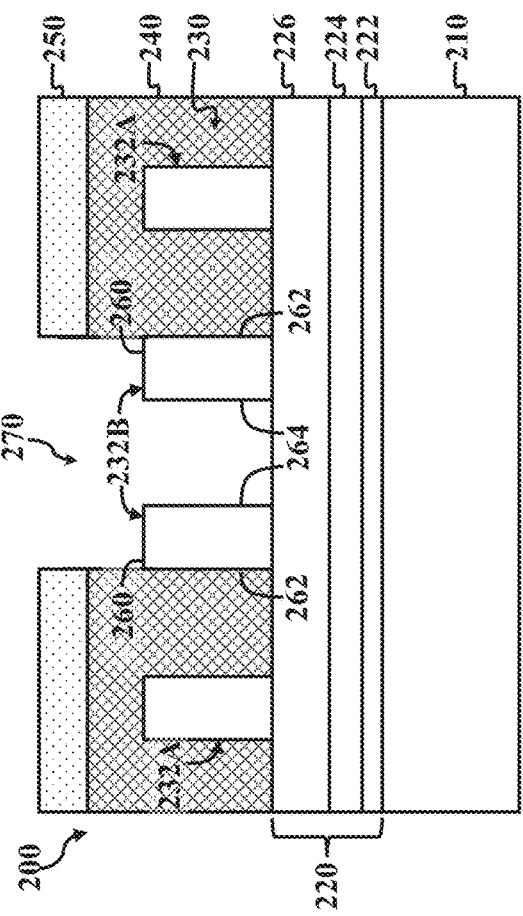

In FIG. 2D, the cut pattern is transferred to guarding material layer 240, thereby forming patterned guarding material layer 240 that partially exposes unprotected mandrels 232B. For example, the cut pattern defines an opening 270 that partially exposes unprotected mandrels 232B. In some implementations, an etching process removes guarding material layer 240 exposed by opening 252 defined in patterned resist layer 250, such as guarding material layer 240 covering top surfaces 260 and sidewalls 264 of unprotected mandrels 232B. Since patterned resist layer 250 masks sidewalls 262, guarding material layer 240 remains on sidewalls 262. The etching process is a dry etching process, a wet etching process, or combinations thereof. In the depicted embodiment, guarding material layer 240 is selectively etched from portions of unprotected mandrels 232B without etching (or without significantly etching) unprotected mandrels 232B. Various etching parameters can be tuned to selectively etch guarding material layer 240, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch guarding material layer 240 using a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. Thereafter, patterned resist layer 250 can be removed, for example, by a stripping process.

In FIG. 2E, unprotected mandrels 232B are removed from mandrel layer 230. For example, an etching process is performed to remove unprotected mandrels 232B exposed by opening 270 defined in guarding material layer 240. Unprotected mandrels 232B are selectively etched without etching (or without significantly etching) guarding material layer 240 and/or patterning layer 220 (in particular, upper patterning layer 226). The etching process is a dry etching process, a wet etching process, or combinations thereof. Various etching parameters can be tuned to selectively etch unprotected mandrels 232B, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch unprotected mandrels 232B using a suitable etching solution, such as an HF based solution, an $H_2SO_4$ based solution, an HCl acid based solution, an $NH_4OH$ based solution, other suitable etching solution, or combinations thereof. Thereafter, in FIG. 2F, any remaining guarding material layer 240 is removed, for example, by a selective etching process as described above with reference to FIG. 2D, leaving protected mandrels 232A disposed over patterning layer 220. Protected mandrels 232A are separated by a space S1, such that mandrels 232A have a pitch P1 (for example, P1=w+S1) that is greater than P.

Figure 2I:
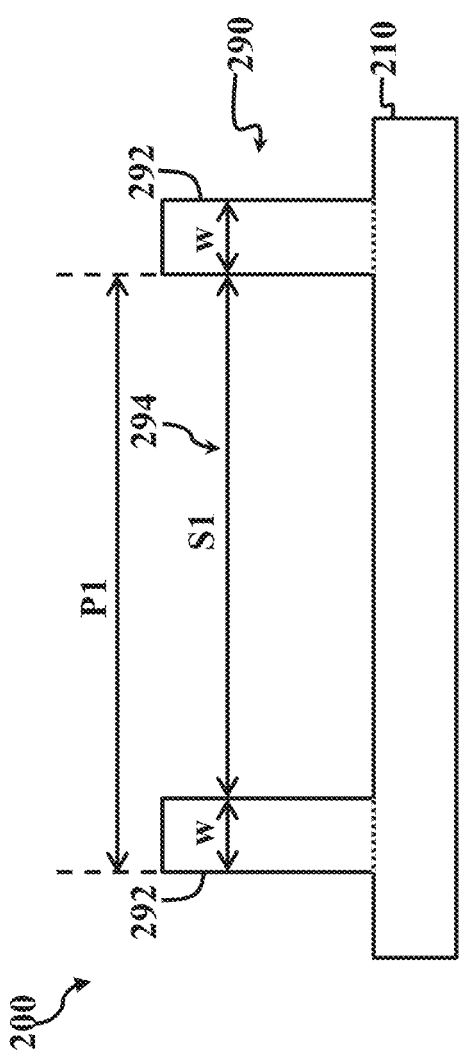

In FIGS. 2G-2I, a fin layer is defined in substrate 210 using mandrel layer 230, in particular, remaining protected mandrels 232B. In FIG. 2G, portions of patterning layer 220 are removed, for example, by an etching process. For example, upper patterning layer 226, middle patterning layer 224, and bottom patterning layer 222 are selectively etched without etching (or without significantly etching) mandrel layer 230, such that protected mandrels 232A serve as an etching mask for removing the portions of patterning layer 220. The etching process is a dry etching process, a wet etching process, or combinations thereof. Various etching parameters can be tuned to selectively etch patterning layer 220, such as etchant composition, etching temperature, etching solution concentration, etching time, etching pressure, source power, RF bias voltage, RF bias power, etchant flow rate, other suitable etching parameters, or combinations thereof. The present disclosure contemplates any combination of etching processes and/or other processes for removing the portions of patterning layer 220. Thereafter, in FIG. 2H, protected mandrels 232 can be removed, for example, by an etching process. The etching process can selectively etch protected mandrels 232A without etching (or without significantly etching) remaining portions of patterning layer 220, which provide patterning features 280 for patterning substrate 210.

In FIG. 2I, portions of substrate 210 are removed to form a fin layer 290, for example, by an etching process. Fin layer 290 includes an array of fins 292, where fins 292 have pitch P1 and adjacent fins 292 are separated by space S1. A trench 294 is defined between fins 292 after the etching process. The etching process is a dry etching process, a wet etching process, or combinations thereof. In some implementations, substrate 210 is selectively etched without etching (or without significantly etching) patterning features 280, such that patterning features 280 serve as an etching mask for removing the portions of substrate 210. Various etching parameters can be tuned to selectively etch patterning layer 220, such as etchant composition, etching temperature, etching solution concentration, etching time, etching pressure, source power, RF bias voltage, RF bias power, etchant flow rate, other suitable etching parameters, or combinations thereof. In some implementations, various layers of patterning features 280 are removed during the etching process. In some implementations, patterning features 280 can be removed after forming fin layer 290.

FinFET device 200 may then undergo further processing to form various features and regions known in the art. For example, an isolation feature(s) is formed in trench 294 to isolate fins 292, thereby isolation various active regions of FinFET device 200. The isolation feature includes silicon oxide, silicon nitride, silicon oxynitride, other suitable isolation material, or combinations thereof. The isolation feature can include different structures, such as STI structures, deep trench isolation (DTI) structures, and/or local oxidation of silicon (LOCOS) structures. In some implementations, the isolation feature is formed by filling trench 294 with insulator material (for example, by using a chemical vapor deposition process or a spin-on glass process). A chemical mechanical polishing (CMP) process may be performed to remove excessive insulator material and/or planarize a top surface of the isolation feature. In some implementations, the isolation feature is formed by depositing an insulator material over substrate 210, such that the insulator material layer fills trench 294 between fins 292, and etching back the insulator material layer. In some implementations, the isolation feature includes a multi-layer structure that fills trench 294, such as a silicon nitride layer disposed over a thermal oxide liner layer. Subsequent processing may include one or more ion implantation processes (for example, into fins 292), may include formation of one or more epitaxially-grown layers (which may include doped layers), and may include formation of gate structures (such as high-K/metal gate stacks). In addition, subsequent processing may include formation of sidewall spacers (for example, on the high-K/metal gate stacks), source/drain features (for example, epitaxially grown source/drain features), etch stop layer(s), interlayer dielectric (ILD) layer(s), contact openings, contact metal, as well as various contacts/vias/lines and multilayers interconnect features (for example, metal layers and interlayer dielectrics) over substrate 210, configured to connect the various features to form a functional circuit, which may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 3C:
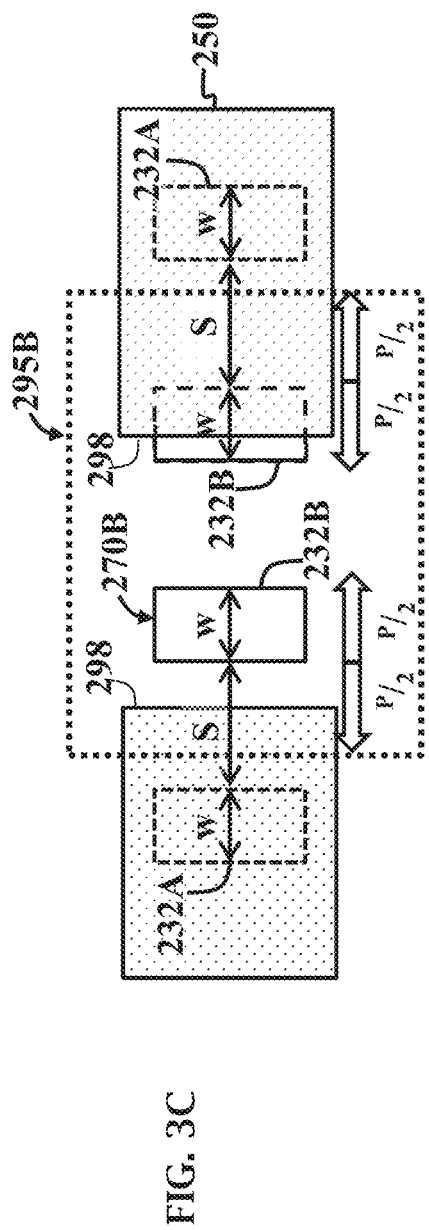

FIGS. 3A-3D illustrate fragmentary, diagrammatic top views of a patterned resist layer, such as patterned resist layer 250, disposed over a material layer, such as mandrel layer 230, according to various aspects of the present disclosure. Though not depicted, guarding material layer 240 is disposed between patterned resist layer 250 and mandrel layer 230, and guarding material layer 240 has been removed as exposed by an opening in patterned resist layer 250. In FIG. 3A, FinFET device 200 undergoes a conventional fin cut first process, where unprotected mandrels 232B are fully exposed. For example, patterned resist layer 250 includes a cut pattern defined by an opening 270A that fully exposes unprotected mandrels 232B, where an overlay window 295A constrains alignment of opening 270A with underlying mandrel layer 230. Overlay window 295A defines boundaries for cut edges 298 that define opening 270A, ensuring that protected mandrels 232A remain covered by guarding material layer 240, while unprotected mandrels 232A are completely free of guarding material layer 240. These boundaries are constrained by space S. For example, conventional fin cut first process often specify an overlay (cut) budget of S/2, such that cut edges 298 can shift no more than a distance S/2 from sidewalls of unprotected mandrels 232B, in a direction that ensures that guarding material layer 240 can be completely removed from unprotected mandrels 232B. As IC technologies continually progress towards smaller feature sizes (such as 32 nanometers, 28 nanometers, 20 nanometers, and below), scaling down of pitch P is shrinking space S between mandrels 232, drastically decreasing the overlay budget. This presents significant challenges to manufacturing ever smaller IC features, such as fins of FinFET devices. One solution for increasing the overlay budget is to reduce width w of mandrels 232, thereby increasing space S. However, this often results in high aspect ratio patterns, which require complicated etching processes.

Figure 3D:
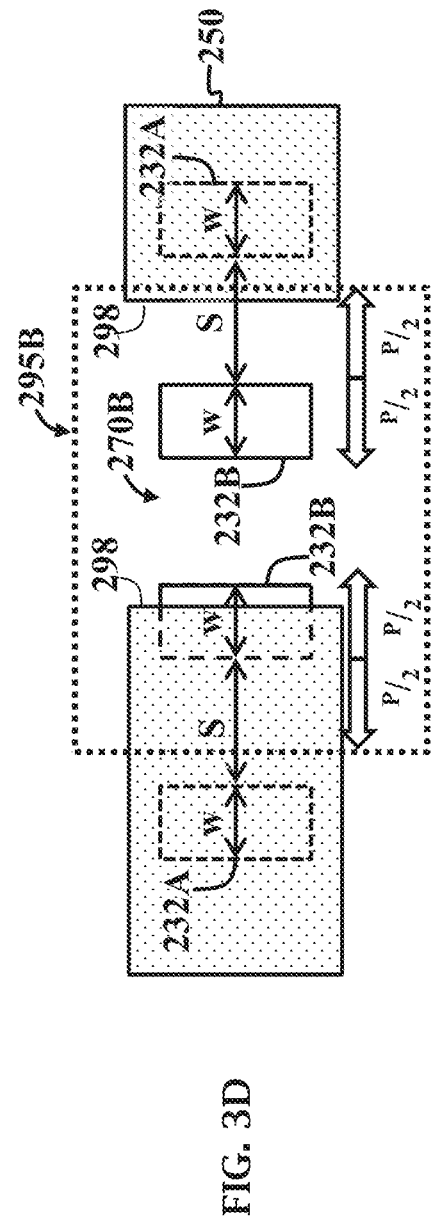

By allowing partial exposure of unprotected mandrels 232B, overlay budgets are significantly increased. For example, in FIG. 3B, FinFET device 200 undergoes a fin cut first POPE process as described herein, such that FIG. 3B provides a top view of FinFET device 200 that corresponds with FIG. 2D. In FIG. 3B, patterned resist layer 250 includes a cut pattern defined respectively by an opening 270B, where an overlay window 295B constrains alignment of opening 270B with underlying mandrel layer 230. Overlay window 295B defines boundaries for cut edges 298 defining opening 270B, ensuring that protected mandrels 232A are covered by guarding material layer 240, while unprotected mandrels 232A are partially free of guarding material layer 240. By allowing partial coverage of unprotected mandrels 232B, boundaries can be constrained by pitch P. Accordingly, the fin cut first POPE process can increase the overlay (cut) budget from S/2 (in other words, (P−w)/2) to P/2, such that cut edges 298 can shift a distance P/2, either direction, from sidewalls of unprotected mandrels 232B, as depicted in FIG. 3B. Such compensates for larger overlay errors than conventional fin cut first processes, allowing large shifts in opening 270B relative to mandrel layer 230. For example, in FIG. 3C, opening 270B is shifted to the left, fully exposing one unprotected mandrel 232B while partially exposing another unprotected mandrel 232B. In FIG. 3D, opening 270B is shifted to the right, fully exposing one unprotected mandrel 232B while partially exposing another unprotected mandrel 232B. In some implementations, the fin cut first POE processes can provide a 40% to 50% increase in overlay (cut) margins. And such is achieved without high aspect ratio patterns and/or without defects (such as residue portions of unprotected mandrels 232B), increasing manufacturing ease and IC design flexibility. Different embodiments may have different advantages, and no particular advantage is necessarily required of any embodiment.

FIGS. 4A-4I are fragmentary diagrammatic views of a FinFET device 300, in portion or entirety, at various fabrication stages (such as those associated with method 100) according to various aspects of the present disclosure. FinFET device 300 may be included in a microprocessor, a memory, and/or other integrated circuit device. In some implementations, FinFET device 300 may be a portion of IC chip, an SoC, or portion thereof, that includes various passive and active microelectronic devices such as resistors, capacitors, inductors, diodes, MOSFETs, CMOSs, BJTs, LDMOS transistors, high voltage transistors, high frequency transistors, other suitable components, or combinations thereof. FinFET device 300 is similar in many respects to FinFET device 200. Accordingly, similar features in FIGS. 2A-2I and FIGS. 4A-4I are identified by the same reference numerals for clarity and simplicity. FIGS. 4A-4I have been simplified for the sake of clarity to better understand the inventive concepts of the present disclosure. Additional features can be added in FinFET device 300, and some of the features described below can be replaced, modified, or eliminated in other embodiments of FinFET device 300.

Figure 4A:
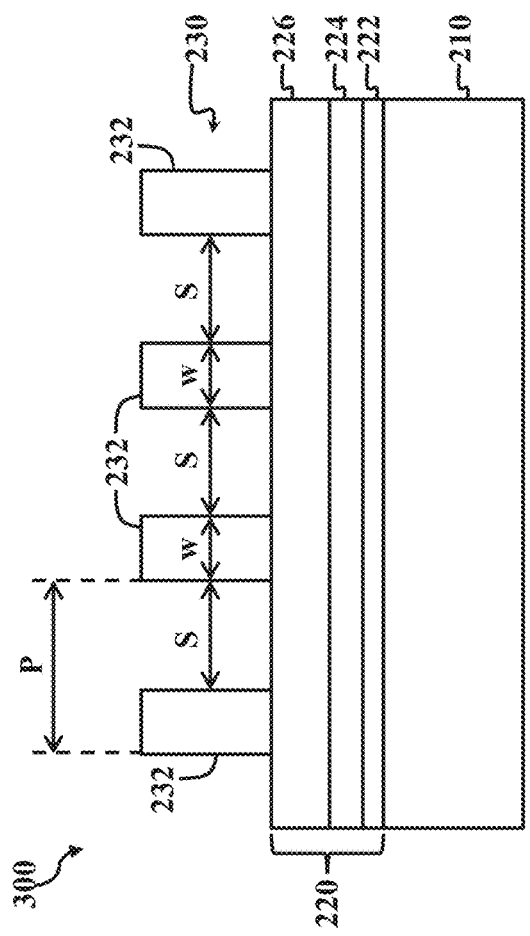

In FIG. 4A, similar to FinFET device 200, FinFET device 300 includes substrate 210, patterning layer 220 disposed over substrate 210, and mandrel layer 230 disposed over patterning layer 220. Mandrel layer 230 includes mandrels 232 (each having width w) having pitch P, where adjacent mandrels 232 are separated by space S. Similar to fabrication of FinFET device 200 described with reference to FIGS. 2B-2F, in FIGS. 4B-4F, a fin cut first POPE process is performed to remove a portion of mandrel layer 230 (for example, a subset of mandrels 232), thereby defining active regions of FinFET device 300. The fin cut first POPE process achieves one or more of the advantages described herein with reference to fin cut POPE processes, including increasing overlay (cut) budgets.

Figure 4B:
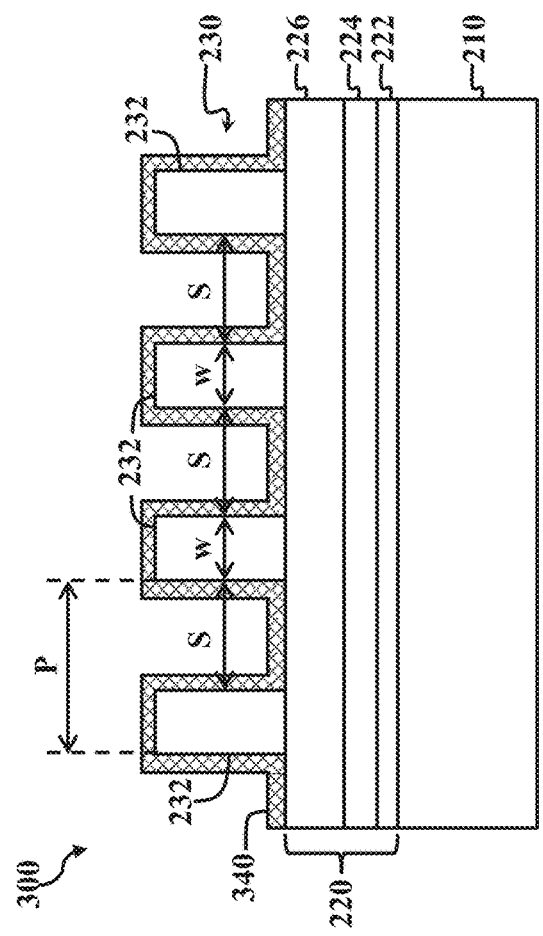

In FIG. 4B, a guarding material layer 340 is formed over mandrel layer 230. In contrast to guarding material layer 240 deposited over mandrel layer 230 of FinFET device 200 in FIG. 2B, guarding material layer 340 does not fill spaces between mandrels 232. For example, guarding material layer 340 is conformally deposited over mandrel layer 230 by any suitable deposition process, such that guarding material layer 340 has a substantially uniform thickness over exposed surfaces of mandrel layer 230 and/or substrate 210. The deposition process can include CVD, PVD, ALD, HDPCVD, MOCVD, RPCVD, PECVD, LPCVD, ALCVD, APCVD, spin coating, plating, other deposition methods, or combinations thereof. Guarding material layer 340 includes a material that is different than mandrel layer 230 to achieve etching selectivity during an etching process, such that mandrel layer 230 can be removed using a corresponding etchant without significant etching of guarding material layer 340, and vice versa. In other words, guarding material layer 340 and mandrel layer 230 include materials having different etch rates. In some implementations, guarding material layer 340 includes a semiconductor material and/or a dielectric material that achieves desired etching selectivity, such as silicon, amorphous silicon, semiconductor oxide, semiconductor nitride, semiconductor oxynitride, or semiconductor carbide. For example, in some implementations where mandrel layer 230 includes SiN, guarding material layer 340 includes silicon.

Figure 4C:
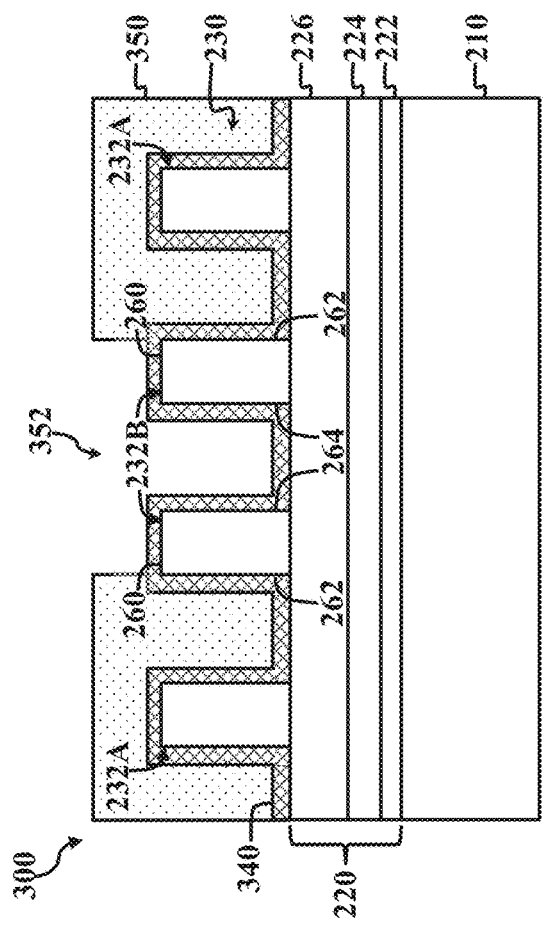

In FIG. 4C, a patterned resist layer 350 is formed over guarding material layer 340. A lithography process may be performed to form patterned resist layer 350, similar to the lithography process described above with reference to patterned resist layer 250. However, in contrast to patterned resist layer 250 formed over guarding material layer 240 of FinFET device 200 in FIG. 2C, patterned resist layer 350 and guarding material layer 340 combine to fill spaces between mandrels 232. After development, patterned resist layer 350 includes a cut pattern that corresponds with the mask pattern, where the cut pattern exposes a portion of mandrel layer 230. For example, the cut pattern exposes a subset of mandrels 232, thereby defining protected mandrels 232A and unprotected mandrels 232B. In FIG. 4C, the cut pattern includes an opening 352 aligned over (overlapping) unprotected mandrels 232B, where opening 352 partially exposes unprotected mandrels 232B. Similar to patterned resist layer 250 formed over guarding material layer 240 of FinFET device 200 in FIG. 2C, patterned resist layer 350 masks sidewalls 262 and unmasks sidewalls 264 and top surfaces 260, thereby exposing guarding material layer 540 covering sidewalls 264 and top surfaces 260. In some implementations, patterned resist layer 350 partially masks top surfaces 260 of unprotected mandrels 232B, partially exposing guarding material layer 340 covering top surfaces 260. In some implementations, patterned resist layer 350 fully masks top surfaces 260 of unprotected mandrels 232B, exposing only guarding material layer 340 covering sidewalls 264. In some implementations, portions of unprotected mandrels 232B on which guarding material layer 340 is to remain are protected by patterned resist layer 350, while portions of unprotected mandrels 232B from which guarding material layer 340 is to be removed are free of patterned resist layer 350.

Figure 4D:
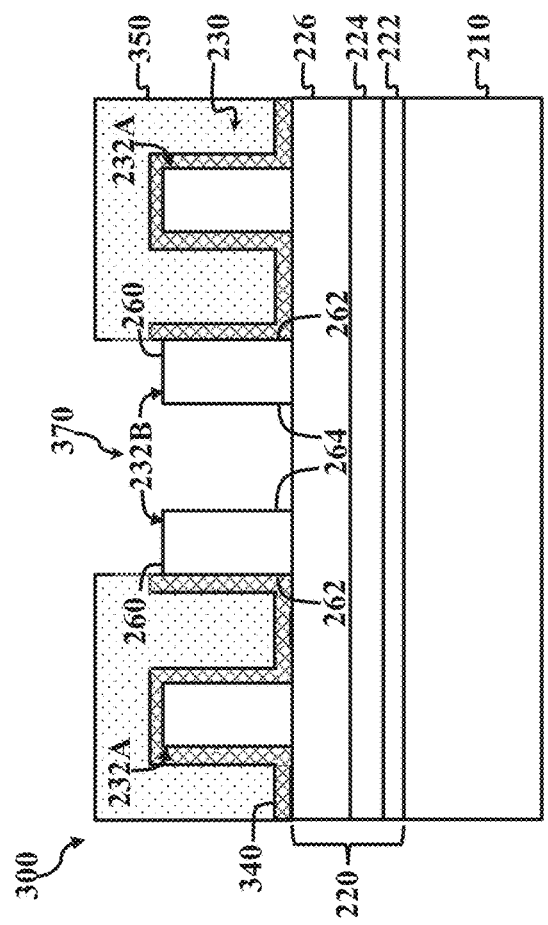

In FIG. 4D, the cut pattern is transferred to guarding material layer 340, thereby forming patterned guarding material layer 340 that partially exposes unprotected mandrels 232B. For example, the cut pattern defines an opening 370 that partially exposes unprotected mandrels 232B. In some implementations, an etching process removes guarding material layer 340 exposed by opening 352 defined in patterned resist layer 350, such as guarding material layer 340 covering top surfaces 260 and sidewalls 264 of unprotected mandrels 232B. Since patterned resist layer 350 masks sidewalls 262, guarding material layer 340 remains on sidewalls 262. In the depicted embodiment, guarding material layer 340 is selectively etched from portions of unprotected mandrels 232B without etching (or without significantly etching) unprotected mandrels 232B. The etching process is similar to the etching process used for removing guarding material layer 240, as described with reference to FIG. 2D.

Figure 4E:
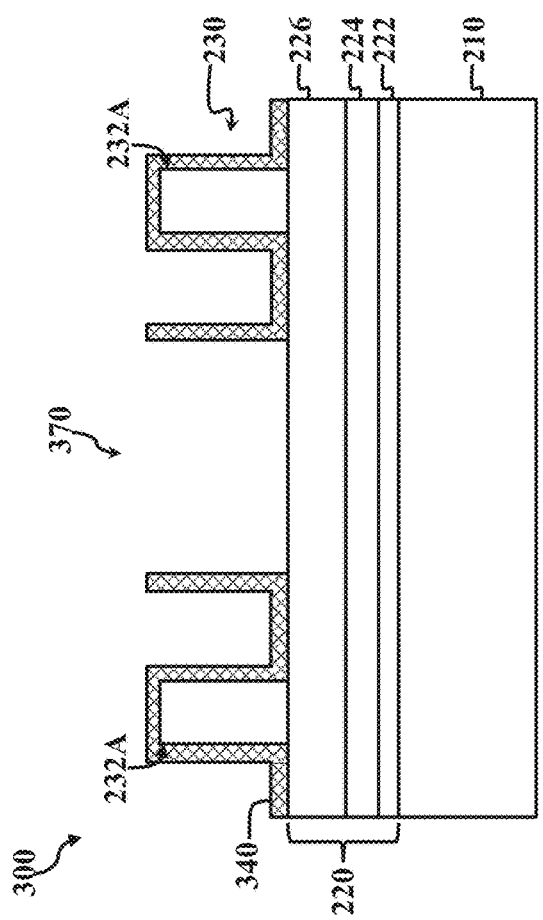
Figure 4F:
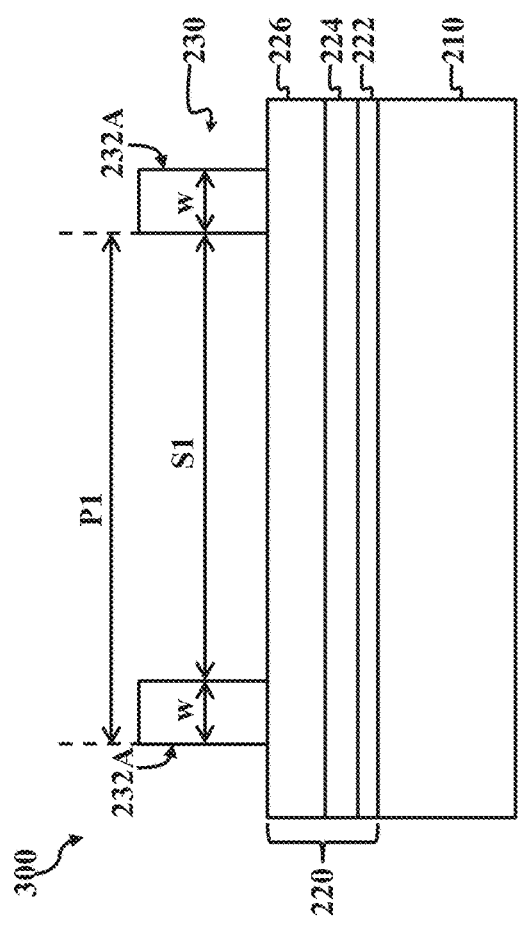
Figure 4I:
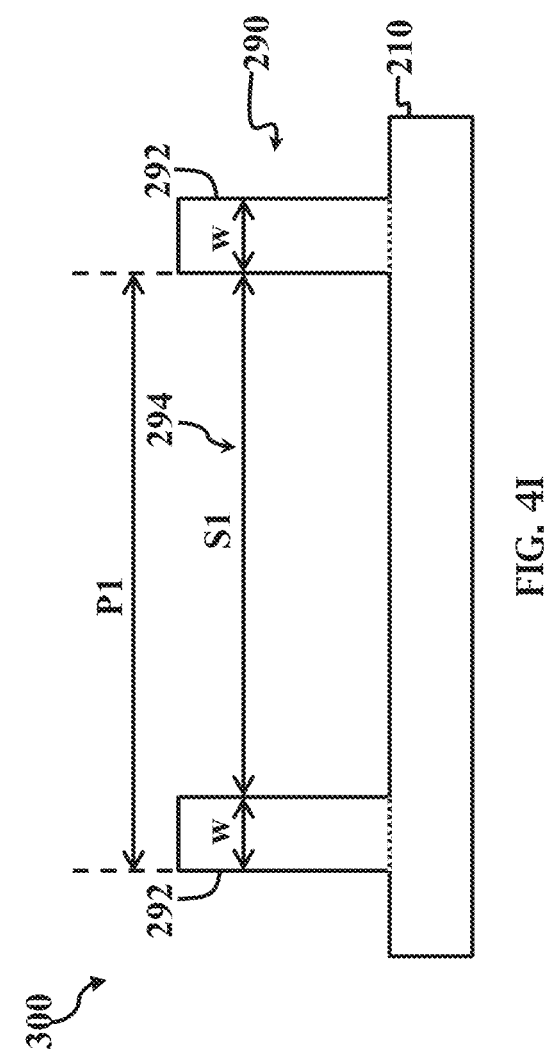

In FIG. 4E, unprotected mandrels 232B are removed from mandrel layer 230. For example, an etching process is performed to remove unprotected mandrels 232B exposed by opening 370 defined in guarding material layer 340. Unprotected mandrels 232B are selectively etched without etching (or significantly etching) guarding material layer 340 and/or patterning layer 220 (in particular, upper patterning layer 226). The etching process is similar to the etching process used for removing unprotected mandrels 232B from FinFET device 200, as described above with reference to FIG. 2E. Thereafter, in FIG. 4F, any remaining guarding material layer 340 is removed, for example, by a selective etching process, such as described above with reference to FIG. 4D, leaving protected mandrels 232A disposed over patterning layer 220. Protected mandrels 232A have pitch P1, where adjacent protected mandrels 232A are separated by S1. In FIGS. 4G-4I, FinFET device 300 undergoes further processing, similar to processing described above for FinFET device 200 with reference to FIGS. 2G-2I. For example, fin layer 290 is defined in substrate 210 using mandrel layer 230 (in particular, remaining protected mandrels 232B), where fin layer 290 includes fins 292. Similar to FinFET device 200, FinFET device 300 can undergo further processing, such as forming an isolation feature in trench 294 defined between fins 292 and/or forming other features of FinFET device 300.

FIGS. 5A-5F are fragmentary diagrammatic views of a FinFET device 400, in portion or entirety, at various fabrication stages (such as those associated with method 100) according to various aspects of the present disclosure. Fin-FET device 400 can be included in a microprocessor, a memory, and/or other integrated circuit device. In some implementations, FinFET device 400 may be a portion of IC chip, an SoC, or portion thereof, that includes various passive and active microelectronic devices such as resistors, capacitors, inductors, diodes, MOSFETs, CMOSs, BJTs, LDMOS transistors, high voltage transistors, high frequency transistors, other suitable components, or combinations thereof. FIGS. 5A-5F have been simplified for the sake of clarity to better understand the inventive concepts of the present disclosure. Additional features can be added in FinFET device 400, and some of the features described below can be replaced, modified, or eliminated in other embodiments of FinFET device 400.

In FIG. 5A, FinFET device 400 includes a substrate (wafer) 410. In the depicted embodiment, substrate 410 includes silicon. Alternatively or additionally, substrate 410 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 410 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 410 can include various doped regions (not shown) depending on design requirements of FinFET device 400. In some implementations, substrate 410 includes p-type doped regions (for example, p-type wells) doped with p-type dopants, such as boron (for example, BF2), indium, other p-type dopant, or combinations thereof. In some implementations, substrate 410 includes n-type doped regions (for example, n-type wells) doped with n-type dopants, such as phosphorus, arsenic, other n-type dopant, or combinations thereof. In some implementations, substrate 410 includes doped regions formed with a combination of p-type dopants and n-type dopants. The various doped regions can be formed directly on and/or in substrate 410, for example, providing a p-well structure, an n-well structure, a dual-well structure, a raised structure, or combinations thereof. Doping may be implemented using a process such as ion implantation or diffusion in various steps and techniques.

A fin layer 430 is defined over substrate 410. In the depicted embodiment, fin layer 430 includes an array of fins 432 (each having a width w) extending from substrate 410, where adjacent fins 432 are separated by a space S. Fins 432 have a pitch P, where pitch generally refers to a sum of a width of an IC feature (such as w of fins 432) and a width of a space adjacent to the IC feature (such as S between fins 432) (in other words, P=w+S). Fins 432 are also referred to as fin features. In some implementations, pitch P is a minimum pitch achievable between fins 432 by a lithography process for a given technology node. In the depicted embodiment, fin layer 430 is a portion of substrate 410. In some implementations, fin layer 430 is formed in a material layer, such as a semiconductor material layer, of substrate 410. For example, in implementations where substrate 410 includes silicon, fin layer 430 includes silicon. Alternatively, in some implementations, fin layer 430 is defined in a material layer, such as a semiconductor material layer, overlying substrate 410.

A combination of deposition, lithography and/or etching processes are performed to define fin layer 430 in substrate 410, such that fins 432 extend from substrate 410 as illustrated in FIG. 5A. For example, forming fin layer 430 includes performing a lithography process to form a patterned resist layer over substrate 410 (or a material layer disposed over substrate 410) and performing an etching process to transfer a pattern defined in the patterned resist layer to substrate 410 (or the material layer disposed over substrate 410). The lithography process can include forming a resist layer on substrate 410 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the lithography process can be implemented or replaced by other methods, such as maskless lithography, electron-beam writing, ion-beam writing, and/or nanoimprint technology. The etching process removes portions of substrate 410, where the etching process uses the patterned resist layer as an etch mask. The etching process can include a dry etching process, a wet etching process, other suitable etching process, or combinations thereof. After the etching process, the patterned resist layer is removed from substrate 410, for example, by a resist stripping process. In some implementations, fin layer 430 is formed by a DPL process, which is a method of constructing a pattern on a substrate by dividing the pattern into two interleaved patterns. DPL allows enhanced IC feature (for example, fin) density. Various DPL methodologies may be used including double exposure (such as using two mask sets), resist freezing, EUV lithography, other suitable processes, or combinations thereof.

Figure 5C:
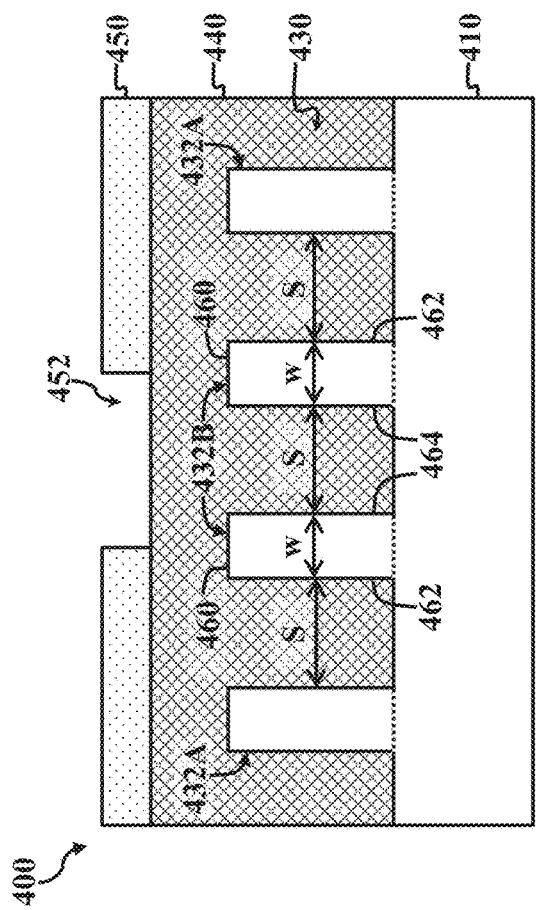

In FIGS. 5B-5F, a fin cut last POPE process is performed to remove a portion of fin layer 430 (for example, a subset of fins 432), thereby defining active regions of FinFET device 400. In FIG. 5B, a guarding material layer 440 is formed over fin layer 430. In the depicted embodiment, guarding material layer 440 is deposited over fin layer 430 by any suitable deposition process, such that guarding material layer 440 fills spaces between fins 432. The deposition process can include CVD, PVD, ALD, HDPCVD, MOCVD, RPCVD, PECVD, LPCVD, ALCVD, APCVD, spin coating, plating, other deposition methods, or combinations thereof. Guarding material layer 440 includes a material that is different than fin layer 430 to achieve etching selectivity during an etching process, such that fin layer 430 can be removed using a corresponding etchant without significant etching of guarding material layer 440, and vice versa. In other words, guarding material layer 440 and fin layer 430 include materials having different etch rates. In some implementations, guarding material layer 440 can include a semiconductor material and/or a dielectric material that achieves desired etching selectivity, such as silicon, amorphous silicon, semiconductor oxide, semiconductor nitride, semiconductor oxynitride, or semiconductor carbide. For example, in implementations where fin layer 430 includes silicon, guarding material layer 440 can include $SiO_2$.

In FIG. 5C, a patterned resist layer 450 is formed over guarding material layer 440. For example, a lithography process is performed to form patterned resist layer 450. The lithography process can include forming a resist layer on guarding material layer 440 (for example, by spin coating), performing a pre-exposure baking process, performing an exposure process using a mask, performing a post-exposure baking process, and performing a developing process. During the exposure process, the resist layer is exposed to radiation energy, where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. Alternatively, the lithography process can be implemented or replaced by other methods, such as maskless lithography, e-beam writing, ion-beam writing, and/or nanoimprint technology. After development, patterned resist layer 450 includes a cut pattern that corresponds with the mask pattern, where the cut pattern exposes a portion of fin layer 430. For example, the cut pattern exposes a subset of fins 432, thereby defining protected fins 432A and unprotected (unwanted) fins 432B. Unprotected fins 432B are to be removed by the fin cut last process. In the depicted embodiment, the cut pattern includes an opening 452 aligned over (overlapping) unprotected fins 432B, where opening 452 partially exposes unprotected fins 432B. For example, unprotected fins 432B include a top surface 460 defined between a sidewall 462 and a sidewall 464, where patterned resist layer 450 masks sidewalls 462 and unmasks sidewalls 464, thereby exposing guarding material layer 440 covering sidewalls 464. In furtherance of the depicted embodiment, patterned resist layer 450 partially masks top surfaces 460 of unprotected fins 432B, partially exposing guarding material layer 440 covering top surfaces 460.

In some implementations, patterned resist layer 450 fully masks top surfaces 460 of unprotected fins 432B, exposing only guarding material layer 440 covering sidewalls 464. In some implementations, portions of unprotected fins 432B on which guarding material layer 440 is to remain are protected by patterned resist layer 450, while portions of unprotected fins 432B from which guarding material layer 440 is to be removed are free of patterned resist layer 450. Further, though the depicted embodiment illustrates two unprotected fins, the present disclosure contemplates embodiments where the subset of fins 432 can include any number of unprotected fins. For example, the subset of fins 432 exposed by the cut pattern can include a single unprotected fin, where the cut pattern exposes a portion (for example, a sidewall) of the single unprotected fin. In another example, the subset of fins 432 exposed by the cut pattern can include more than two unprotected fins, where the cut pattern partially exposes unprotected fins 432B near a perimeter of the cut pattern (for example, by exposing at least one sidewall) and fully exposes unprotected fins 432B disposed between unprotected fins 432B near the perimeter (for example, by exposing top surfaces and sidewalls defining unprotected fins 432B).

Figure 5D:
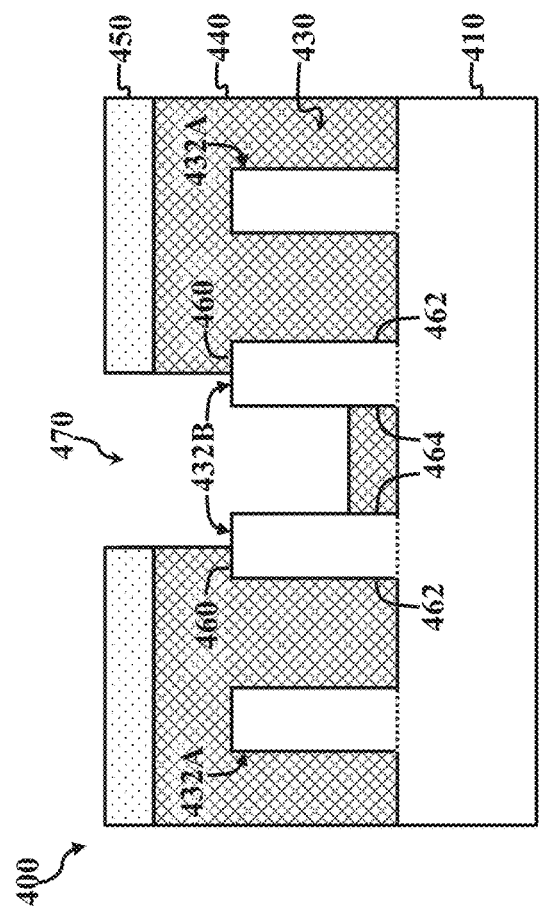

In FIG. 5D, the cut pattern is transferred to guarding material layer 440, thereby forming an opening 470 in guarding material layer 440 that exposes portions of unprotected fins 432B. For example, an etching process removes guarding material layer 440 exposed by opening 452 defined in patterned resist layer 450, such as guarding material layer 440 covering sidewalls 464 of unprotected fins 432B and a portion of guarding material layer 440 covering top surfaces 460 of unprotected fins 432B. Since patterned resist layer 450 masks sidewalls 462 and a portion of top surfaces 460, guarding material layer 440 remains on sidewalls 462 and a portion of top surfaces 460. Guarding material layer 440 is selectively etched from portions of unprotected fins 432B without etching (or significantly etching) unprotected fins 432B. The etching process is a dry etching process, a wet etching process, or combinations thereof. Various etching parameters can be tuned to selectively etch guarding material layer 440, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch guarding material layer 440 using a suitable etching solution, such as an HF based solution, an $H_2SO_4$ based solution, an HCl acid based solution, an $NH_4OH$ based solution, other suitable etching solution, or combinations thereof. In the depicted embodiment, guarding material layer 440 is not completely removed from sidewalls 464. However, the present disclosure contemplates embodiments where the etching process completely removes guarding material layer 440 from sidewalls 464. Thereafter, patterned resist layer 450 can be removed, for example, by a stripping process.

Figure 5E:
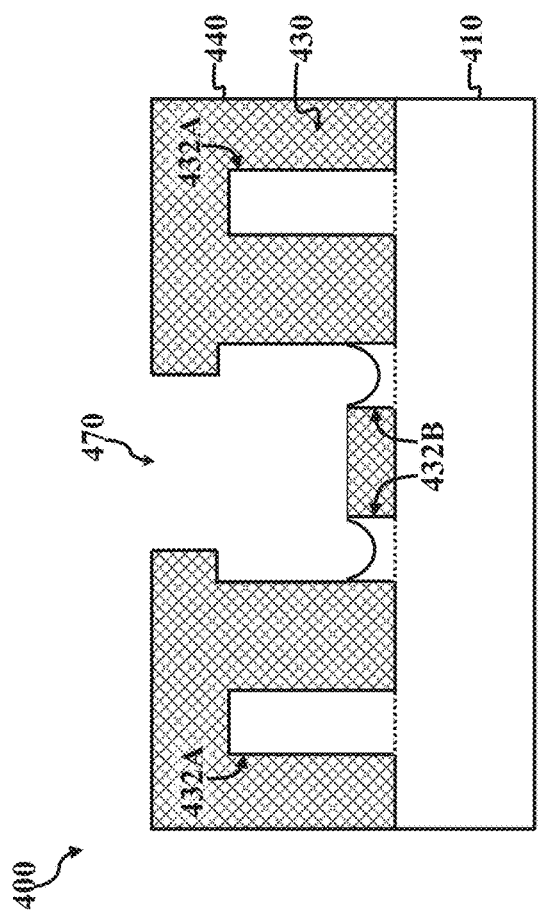
Figure 5F:
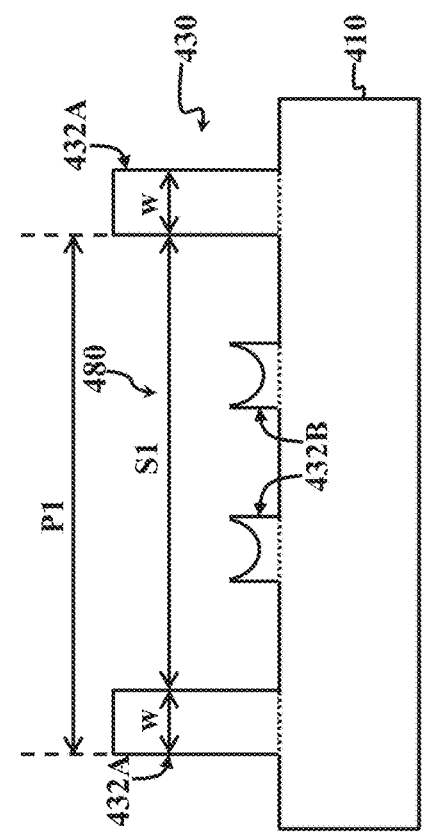

In FIG. 5E, unprotected fins 432B are removed from fin layer 430. For example, an etching process is performed to remove unprotected fins 432B exposed by opening 470 defined in guarding material layer 440. Unprotected fins 432B are selectively etched without etching (or significantly etching) guarding material layer 440. The etching process is a dry etching process, a wet etching process, or combinations thereof. Various etching parameters can be tuned to selectively etch unprotected fins 432B, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch unprotected fins 432B using a suitable etching solution, such as an HF based solution, an $H_2SO_4$ based solution, an HCl acid based solution, an $NH_4OH$ based solution, other suitable etching solution, or combinations thereof. In the depicted embodiment, since guarding material layer 440 is not completely removed from sidewalls 464, a portion of unprotected fins 432B remains extending from substrate 410. Such remaining portion can be referred to as residue fins. Thereafter, in FIG. 5F, any remaining guarding material layer 440 is removed, for example, by a selective etching process as described above with reference to FIG. 5D, leaving protected fins 432A extending from substrate 410. Protected fins 432A are separated by a space S1, such that protected fins 432A have a pitch P1 (for example, P1=w+S1) that is greater than P. A trench 294 is defined between protected fins 432A.

FinFET device 400 may then undergo further processing to form various features and regions known in the art. For example, an isolation feature(s) is formed in trench 480 to isolate protected fins 432A, thereby isolation various active regions of FinFET device 400. The isolation feature includes silicon oxide, silicon nitride, silicon oxynitride, other suitable isolation material, or combinations thereof. The isolation feature can include different structures, such as STI structures, deep trench isolation (DTI) structures, and/or local oxidation of silicon (LOCOS) structures. In some implementations, the isolation feature is formed by filling trench 480 with insulator material (for example, by using a chemical vapor deposition process or a spin-on glass process). A chemical mechanical polishing (CMP) process may be performed to remove excessive insulator material and/or planarize a top surface of the isolation feature. In some implementations, the isolation feature is formed by depositing an insulator material over substrate 410, such that the insulator material layer fills trench 480 between protected fins 432A, and etching back the insulator material layer. In some implementations, the isolation feature includes a multi-layer structure that fills trench 480, such as a silicon nitride layer disposed over a thermal oxide liner layer. Subsequent processing may include one or more ion implantation processes (for example, into protected fins 432A), may include formation of one or more epitaxially-grown layers (which may include doped layers), and may include formation of gate structures (such as high-K/metal gate stacks). In addition, subsequent processing may include formation of sidewall spacers (for example, on the high-K/ metal gate stacks), source/drain features (for example, epitaxially grown source/drain features), etch stop layer(s), interlayer dielectric (ILD) layer(s), contact openings, contact metal, as well as various contacts/vias/lines and multilayers interconnect features (for example, metal layers and interlayer dielectrics) over substrate 410, configured to connect the various features to form a functional circuit, which may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

The fin cut last POPE process described with reference to FIGS. 5A-5F achieves advantages similar to the fin cut first POPE process, such as increasing overlay (cut) budgets as described with reference to FIGS. 3A-3D. For example, the fin cut last POPE process can increase the overlay (cut) budget from S/2 (in other words, (P-w)/2) to P/2, allowing large shifts in opening 452 relative to mandrel layer 230. In some implementations, the fin cut first POPE processes can provide a 40% to 50% increase in overlay (cut) margins. Such can be achieved without high aspect ratio patterns and/or without defects (such as residue portions of unprotected mandrels 232B that affect FinFET device characteristics), increasing manufacturing ease and IC design flexibility. For example, FIG. 6A provides various views of FinFET device 400 undergoing a conventional fin cut last process according to various aspects of the present disclosure, and FIG. 6B provides various views of FinFET device 400 undergoing a fin cut last POPE process according to various aspects of the present disclosure. FinFET device 400 is depicted three-dimensionally before and after removal of unprotected fins 432B, where an X-CUT is a cross-sectional view of FinFET device 400 before and after removal of unprotected fins 432B taken along an x-direction of one of unprotected fins 432B and a Y-CUT is a cross-sectional view of FinFET device 400 before and after removal of unprotected fins 432B taken along a y-direction.

In FIG. 6A, where FinFET device 400 undergoes conventional fin cut last process, unprotected fins 432B are fully exposed. For example, a patterning layer 490 includes a cut pattern defined by an opening 492 that fully exposes top surfaces of unprotected mandrels 432B. Unprotected fins 432B are then removed by an etching process, thereby forming trenches 494, where sidewalls of trenches 494 define line ends (such as ends of fins). In the X-CUT, trenches 494 include tapered sidewalls, which can result in fins not exhibiting desired critical dimensions. In the Y-CUT, a portion of unprotected fins 432B remains in trenches 494 (referred to as residue fins), often arising from a high aspect ratio of trenches 494. Such defects can negatively affect performance of FinFET device 400. To minimize issues arising from tapered sidewalls and fin residue, conventional fin cut last process often requires an anisotropic etching process.

In FIG. 6B, where FinFET device 400 undergoes fin cut last POPE process, unprotected fins 432B are partially exposed. For example, guarding material layer 440 includes a cut pattern defined by opening 470 that partially exposes top surfaces and one of the sidewalls of unprotected mandrels 432B, as described in detail above with reference to FIGS. 5B-5F. Unprotected fins 432B are then removed by an etching process, thereby forming a trench 496, where sidewalls of trenches 496 define line ends (such as ends of fins). In contrast to conventional fin cut process, fin cut last POPE process provides line end critical dimension control and/or reduces defects (such as fin residue). For example, in contrast to trenches 494, trench 496 includes non-tapered sidewalls, improving line end critical dimension. In another example, trench 496 overcomes high aspect ratio limitations of conventional fin cut last process, reducing the portion of unprotected fins 432B remaining in trench 496 after the etching process. Fin cut last POPE process thus provides processing flexibility, allowing use of an isotropic etching process for removing unprotected fins 432B, which can reduce etching process requirements (such as time and energy). Different embodiments may have different advantages, and no particular advantage is necessarily required of any embodiment.

FIGS. 7A-7F are fragmentary diagrammatic views of a FinFET device 500, in portion or entirety, at various fabrication stages (such as those associated with method 100) according to various aspects of the present disclosure. FinFET device 500 may be included in a microprocessor, a memory, and/or other integrated circuit device. In some implementations, FinFET device 500 may be a portion of IC chip, an SoC, or portion thereof, that includes various passive and active microelectronic devices such as resistors, capacitors, inductors, diodes, MOSFETs, CMOSs, BJTs, LDMOS transistors, high voltage transistors, high frequency transistors, other suitable components, or combinations thereof. FinFET device 500 is similar in many respects to FinFET device 400. Accordingly, similar features in FIGS. 5A-5F and FIGS. 7A-7F are identified by the same reference numerals for clarity and simplicity. FIGS. 7A-7F have been simplified for the sake of clarity to better understand the inventive concepts of the present disclosure. Additional features can be added in FinFET device 500, and some of the features described below can be replaced, modified, or eliminated in other embodiments of FinFET device 500.

In FIG. 7A, similar to FinFET device 400, FinFET device 500 includes substrate 410, where fin layer 430 is defined over substrate 410. In the depicted embodiment, fin layer 430 includes an array of fins 432 (each having a width w) extending from substrate 410, where fins 432 have pitch P and adjacent fins 432 are separated by space S. Similar to fabrication of FinFET device 400 described with reference to FIGS. 5B-5F, in FIGS. 4B-4F, a fin cut last POPE process is performed to remove a portion of fin layer 430 (for example, a subset of fins 432), thereby defining active regions of FinFET device 500. The fin cut last POPE process achieves one or more of the advantages described herein with reference to fin cut POPE processes, including increasing overlay (cut) budgets.

In FIG. 7B, a guarding material layer 540 is formed over fin layer 430. In contrast to guarding material layer 540 deposited over fin layer 430 of FinFET device 400 in FIG. 5B, guarding material layer 540 does not fill spaces between fins 432. For example, guarding material layer 540 is conformally deposited over fin layer 430 by any suitable deposition process, such that guarding material layer 540 has a substantially uniform thickness over exposed surfaces of fin layer 430 and/or substrate 410. The deposition process can include CVD, PVD, ALD, HDPCVD, MOCVD, RPCVD, PECVD, LPCVD, ALCVD, APCVD, spin coating, plating, other deposition methods, or combinations thereof. Guarding material layer 540 includes a material that is different than fin layer 430 to achieve etching selectivity during an etching process, such that fin layer 430 can be removed using a corresponding etchant without significant etching of guarding material layer 540, and vice versa. In other words, guarding material layer 540 and fin layer 430 include materials having different etch rates. In some implementations, guarding material layer 540 includes a semiconductor material and/or a dielectric material that achieves desired etching selectivity, such as silicon, amorphous silicon, semiconductor oxide, semiconductor nitride, semiconductor oxynitride, or semiconductor carbide. For example, in implementations where fin layer 430 includes silicon, guarding material layer 540 can include $SiO_2$.

Figure 7C:
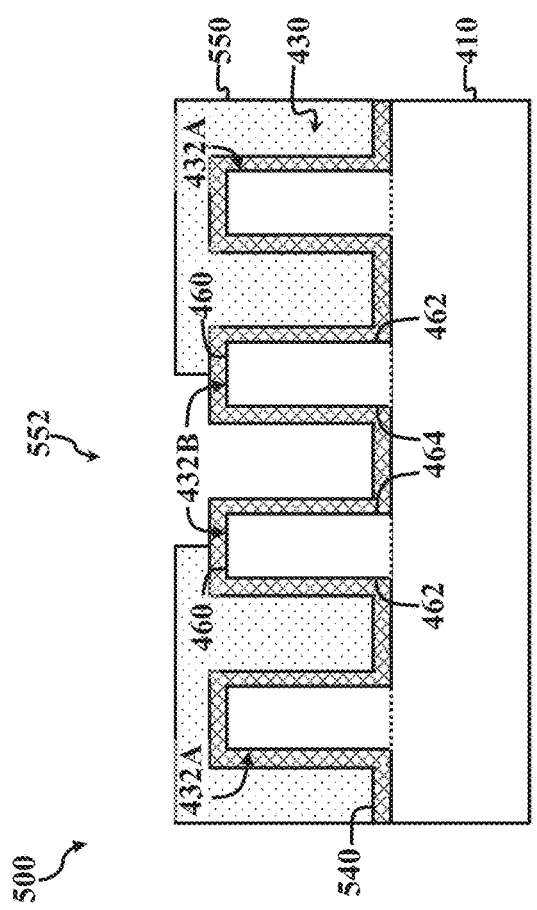

In FIG. 7C, a patterned resist layer 550 is formed over guarding material layer 540. In some implementations, a lithography process is performed to form patterned resist layer 550, similar to the lithography process described above with reference to patterned resist layer 450. However, in contrast to patterned resist layer 450 formed over guarding material layer 440 of FinFET device 400 in FIG. 5C, patterned resist layer 550 and guarding material layer 540 combine to fill spaces between fins 432. After development, patterned resist layer 550 includes a cut pattern that corresponds with the mask pattern, where the cut pattern exposes a portion of fin layer 430. For example, the cut pattern exposes a subset of fins 432, thereby defining protected fins 432A and unprotected fins 432B. In FIG. 7C, the cut pattern includes an opening 552 aligned over (overlapping) unprotected fins 432B, where opening 552 partially exposes unprotected fins 432B. Similar to patterned resist layer 450 formed over guarding material layer 440 of FinFET device 400 in FIG. 5C, patterned resist layer 550 masks sidewalls 462 and unmasks sidewalls 464, thereby exposing guarding material layer 540 covering sidewalls 464. Patterned resist layer 550 also partially masks top surfaces 460 of unprotected fins 432B, partially exposing guarding material layer 540 covering top surfaces 460. In some implementations, patterned resist layer 550 fully masks top surfaces 460 of unprotected fins 432B, exposing only guarding material layer 540 covering sidewalls 464. In some implementations, portions of unprotected fins 432B on which guarding material layer 540 is to remain are protected by patterned resist layer 550, while portions of unprotected fins 432B from which guarding material layer 540 is to be removed are free of patterned resist layer 550.

Figure 7D:
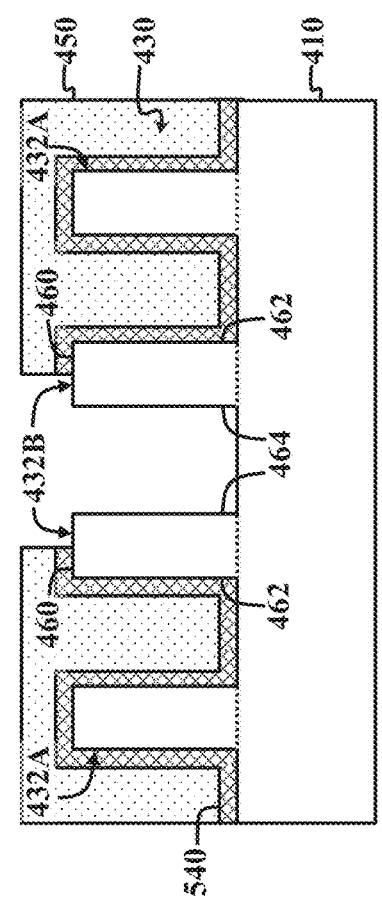

In FIG. 7D, the cut pattern is transferred to guarding material layer 540, thereby forming an opening 570 in guarding material layer 540 that exposes portions of unprotected fins 432B. For example, an etching process removes guarding material layer 540 exposed by opening 552 defined in patterned resist layer 550, such as guarding material layer 540 covering sidewalls 464 of unprotected fins 432B and a portion of guarding material layer 540 covering top surfaces 460 of unprotected fins 432B. Since patterned resist layer 550 masks sidewalls 462 and a portion of top surfaces 460, guarding material layer 540 remains on sidewalls 462 and a portion of top surfaces 460. Guarding material layer 540 is selectively etched from portions of unprotected fins 432B without etching (or significantly etching) unprotected fins 432B. The etching process is similar to the etching process used for removing guarding material layer 440, as described with reference to FIG. 5D. However, in the depicted embodiment, in contrast to removal of guarding material layer 440 from FinFET device 400 in FIG. 5D, guarding material layer 540 is completely removed from sidewalls 464.

Figure 7E:
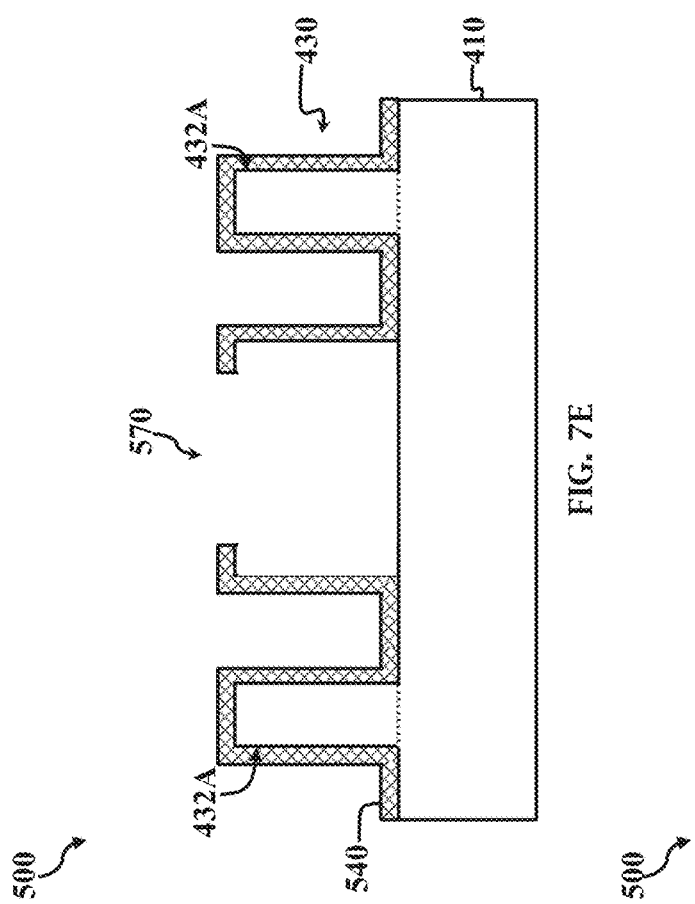
Figure 7F:
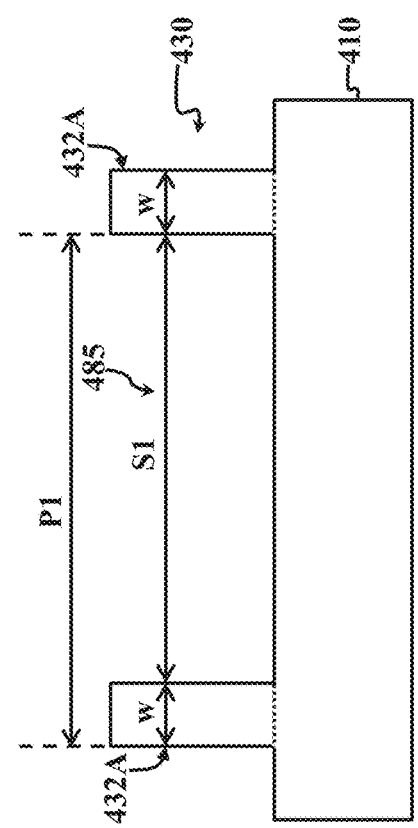

In FIG. 7E, unprotected fins 432B are removed from fin layer 430. For example, an etching process is performed to remove unprotected fins 432B exposed by opening 570 defined in guarding material layer 540. Unprotected fins 432B are selectively etched without etching (or significantly etching) guarding material layer 540. The etching process is similar to the etching process used for removing unprotected fins 432B from FinFET device 400, as described above with reference to FIG. 5E. Thereafter, in FIG. 7F, any remaining guarding material layer 540 is removed, for example, by a selective etching process as described above with reference to FIG. 7D, leaving protected fins 432A extending from substrate 410 having a trench 485 defined therebetween.

Similar to FinFET device 400, FinFET device 500 can undergo further processing, such as forming an isolation feature in trench 485 defined between protected fins 432A and/or forming other features of FinFET device 500.

The present disclosure provides for many different embodiments of a method for patterning integrated circuit devices, such as fin-like field effect transistor devices. An exemplary method (which may be referred to as a POPE process) includes forming a material layer that includes an array of fin features, and performing a fin cut process to remove a subset of the fin features. The fin cut process includes exposing the subset of fin features using a cut pattern and removing the exposed subset of the fin features. The cut pattern partially exposes at least one fin feature of the subset of fin features. In implementations where the fin cut process is a fin cut first process, the material layer is a mandrel layer and the fin features are mandrels. In such implementations, the method can further include, after performing the fin cut process, using the mandrel layer to pattern an underlying layer. In implementations where the fin cut process is a fin cut last process, the material layer is a substrate (or material layer thereof), and the fin features are fins defined in the substrate (or material layer thereof). In such implementations, the method can further include patterning a substrate to form fins, wherein the material layer is the substrate, the fin features are the fins, and the fin cut process is a fin cut last process. In some implementations, the at least one fin feature includes a first sidewall and a second sidewall, where the first sidewall is exposed by the cut pattern and the second sidewall is not exposed by the cut pattern. In some implementations, the array of fin features have a pitch, and the fin cut process changes the pitch of the array of fin features.

In some implementations, the exposing includes forming a guarding material layer over the material layer, such that the guarding material layer covers the array of fin features. The exposing can further include removing the guarding material layer covering the subset of fin features, wherein the guarding material layer is partially removed from the at least one fin feature, such that the guarding material layer remains on a portion of the at least one fin feature. In some implementations, the exposing further includes forming a patterned resist layer over the guarding material layer, where the patterned resist layer having an opening defined therein that partially overlaps the at least one fin feature. The exposing can further include removing a portion of the guarding material layer exposed in the opening. In some implementations, the material layer and the guarding material layer include materials that achieve etching selectivity during an etching process used to remove the guarding material layer and an etching process used to remove the exposed subset of the fin features. In some implementations, the guarding material layer fills spaces between the fin features. In some implementations, the guarding material layer conformally covers the fin features.

Another exemplary method (which may be referred to as a POPE process) includes forming a plurality of mandrels over a substrate, forming a guarding material layer over the plurality of mandrels, removing a portion of the guarding material layer to partially expose a mandrel of the plurality of mandrels, and removing the partially exposed mandrel. Partially exposing the mandrel can include removing the guarding material layer from a first sidewall of the mandrel, while the guarding material layer remains on a second sidewall of the mandrel. In some implementations, removing the portion of the guarding material layer includes selectively etching the guarding material layer. In some implementations, removing the portion of the guarding material layer further includes forming a patterned resist layer over the guarding material layer, the patterned resist layer having an opening defined therein that partially overlaps the mandrel, and further wherein the guarding material layer is selectively etched within the opening. In some implementations, removing the partially exposed mandrel includes selectively etching the partially exposed mandrel.

Another exemplary method (which may be referred to as a POPE process) includes forming a plurality of fins over a substrate, forming a guarding material layer over the plurality of fins, removing a portion of the guarding material layer to partially expose a fin of the plurality of fins, and removing the partially exposed fin. Partially exposing the fin can include removing the guarding material layer from a first sidewall of the fin, while the guarding material layer remains on a second sidewall of the fin. In some implementations, removing the portion of the guarding material layer includes selectively etching the guarding material layer. In some implementations, removing the portion of the guarding material layer further includes forming a patterned resist layer over the guarding material layer, the patterned resist layer having an opening defined therein that partially overlaps the fin, and further wherein the guarding material layer is selectively etched within the opening. In some implementations, removing the partially exposed fin includes selectively etching the partially exposed fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a first fin feature and a second fin feature over a material layer, wherein each of the first fin feature and the second fin feature includes a first material;
   depositing a guarding material layer over the first fin feature and the second fin feature, such that the guarding material layer covers sidewalls of the first fin feature and sidewalls of the second fin feature, wherein the guarding material layer includes a second material that is different than the first material;
   etching the guarding material layer from a first one of the sidewalls of the second fin feature, wherein the guarding material layer remains on the sidewalls of the first fin feature and a second one of the sidewalls of the second fin feature after the etching the guarding material layer from the first one of the sidewalls of the second fin feature; and
   after etching to remove the second fin feature from over the material layer, etching to remove the guarding material layer that remains on the sidewalls of the first fin feature.
2. The method of claim 1, wherein:
   the first material is silicon nitride;
   the second material is silicon;

the etching the guarding material layer is configured to etch the silicon without substantially etching the silicon nitride; and the etching the second fin feature is configured to etch the silicon nitride without substantially etching the silicon.

3. The method of claim 1, wherein the depositing the guarding material layer includes filling a space between the first fin feature and the second fin feature.

4. The method of claim 1, wherein the depositing the guarding material layer includes not filling a space between the first fin feature and the second fin feature.

5. The method of claim 1, wherein the depositing the guarding material layer over the first fin feature and the second fin feature includes performing a conformal deposition process, such that the guarding material layer has a substantially uniform thickness over the first fin feature and the second fin feature.

6. The method of claim 1, wherein the etching the guarding material layer from the first one of the sidewalls of the second fin feature includes completely removing the guarding material layer from the first one of the sidewalls of the second fin feature.

7. The method of claim 1, wherein the etching the guarding material layer from the first one of the sidewalls of the second fin feature includes partially removing the guarding material layer from the first one of the sidewalls of the second fin feature.

8. The method of claim 1, wherein the etching the second fin feature from over the material layer includes partially removing the second fin feature from over the material layer, such that a residual portion of the second fin feature remains over the material layer.

9. The method of claim 1, further comprising patterning an underlying layer using the first fin feature as an etch mask.

10. The method of claim 1, wherein the etching the guarding material layer from the first one of the sidewalls of the second fin feature further includes etching the guarding material layer from at least a portion of a top surface of the second fin feature.

11. A method comprising:
depositing a first material layer over a second material layer;
forming a first mandrel and a second mandrel over the first material layer;
depositing a third material layer over the first mandrel, the second mandrel, and the first material layer;
forming a patterned fourth material layer over the third material layer, wherein the patterned fourth material layer has an opening defined therein that exposes a portion of the third material layer, such that the patterned fourth material layer fully masks the first mandrel and partially masks the second mandrel;
etching the exposed portion of the third material layer to partially expose the second mandrel using the patterned fourth material layer as an etch mask;
removing the patterned fourth material layer and a remainder of the third material layer to expose the first mandrel and the first material layer;
before removing the remainder of the third material layer, etching to remove the partially exposed second mandrel;

after removing the remainder of the third material layer and the partially exposed second mandrel, etching the first material layer using the first mandrel as an etch mask; and
etching the second material layer using the etched first material layer as an etch mask.

12. The method of claim 11, wherein the etching the exposed portion of the third material layer to partially expose the second mandrel includes at least partially removing the third material layer from a first sidewall of the second mandrel while the third material layer remains on a second sidewall of the second mandrel.

13. The method of claim 11, wherein the etching the first material layer forms a patterned feature and the etching the second material layer forms a fin.

14. The method of claim 11, wherein a thickness of the third material layer is greater than a height of the first mandrel and the second mandrel.

15. The method of claim 11, wherein a thickness of the third material layer is less than a height of the first mandrel and the second mandrel.

16. A method comprising:
forming a first semiconductor fin and a second semiconductor fin over a substrate;
depositing a first material layer over the first semiconductor fin, the second semiconductor fin, and the substrate;
forming a patterned second material layer over the first material layer, wherein the patterned second material layer has an opening defined therein that exposes a portion of the first material layer, such that the patterned second material layer fully masks the first semiconductor fin and partially masks the second semiconductor fin;
etching the exposed portion of the first material layer to partially expose the second semiconductor fin;
etching the partially exposed second semiconductor fin; and
removing the patterned second material layer and a remainder of the first material layer to expose the first semiconductor fin and the substrate.

17. The method of claim 16, wherein the etching the exposed portion of the first material layer to partially expose the second semiconductor fin includes at least partially removing the first material layer from a first sidewall of the second semiconductor fin while the first material layer remains on a second sidewall of the second semiconductor fin.

18. The method of claim 16, wherein the etching the partially exposed second semiconductor fin includes partially removing the second semiconductor fin, such that a residual portion of the second semiconductor fin remains over the substrate.

19. The method of claim 16, wherein a thickness of the first material layer is greater than a height of the first semiconductor fin and the second semiconductor fin.

20. The method of claim 16, wherein a thickness of the first material layer is less than a height of the first semiconductor fin and the second semiconductor fin.

* * * * *